United States Patent
Sasago et al.

(10) Patent No.: US 7,195,967 B2
(45) Date of Patent: Mar. 27, 2007

(54) NONVOLATILE SEMICONDUCTOR MEMORY DEVICE AND MANUFACTURING METHOD THEREOF

(75) Inventors: Yoshitaka Sasago, Kokubunji (JP); Takashi Kobayashi, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 84 days.

(21) Appl. No.: 10/701,497

(22) Filed: Nov. 6, 2003

(65) Prior Publication Data

US 2004/0102008 A1 May 27, 2004

Related U.S. Application Data

(62) Division of application No. 10/166,145, filed on Jun. 11, 2002, now Pat. No. 6,670,671.

(30) Foreign Application Priority Data

Jun. 13, 2001 (JP) .............................. 2001-177928

(51) Int. Cl.
    *H01L 21/336* (2006.01)
(52) U.S. Cl. ...................... 438/217; 438/258; 438/266; 438/290; 438/291; 438/302; 438/525
(58) Field of Classification Search ................ 438/201, 438/217, 289–291, 257–258, 266, 276, 302, 438/525
    See application file for complete search history.

(56) References Cited

U.S. PATENT DOCUMENTS

| | | | |
|---|---|---|---|
| 4,561,004 A | 12/1985 | Kuo et al. ................... 257/319 |
| 4,745,083 A | 5/1988 | Huie ......................... 257/316 |
| 5,095,344 A | 3/1992 | Harari ....................... 357/23.5 |
| 5,429,971 A * | 7/1995 | Yang .......................... 438/258 |
| 5,445,983 A * | 8/1995 | Hong .......................... 438/258 |
| 5,455,792 A * | 10/1995 | Yi .......................... 365/185.15 |
| 5,640,032 A | 6/1997 | Tomioka ...................... 257/316 |
| 5,712,180 A * | 1/1998 | Guterman et al. ........... 438/263 |
| 5,739,569 A | 4/1998 | Chen .......................... 257/322 |
| 5,773,863 A | 6/1998 | Burr et al. .................. 257/316 |
| 6,211,011 B1 * | 4/2001 | Chen .......................... 438/257 |
| 6,232,173 B1 * | 5/2001 | Hsu et al. .................... 438/253 |
| 6,323,517 B1 * | 11/2001 | Park et al. ................... 257/326 |
| 6,368,915 B1 * | 4/2002 | Montree et al. ............. 438/257 |
| 6,432,761 B1 * | 8/2002 | Gerber et al. ............... 438/217 |
| 6,492,690 B2 | 12/2002 | Ueno et al. .................. 257/316 |
| 2003/0235953 A1 * | 12/2003 | Sasago et al. .............. 438/257 |

FOREIGN PATENT DOCUMENTS

| | | |
|---|---|---|
| JP | 2694618 | 9/1997 |
| JP | 9-321157 | 12/1997 |

OTHER PUBLICATIONS

K. Naruke et al., "A New Flash-Erase EEPROM Cell with a Sidewall Select-Gate on its Source Side", IEDM, 1989, pp. 603-606.

* cited by examiner

*Primary Examiner*—M. Wilczewski
*Assistant Examiner*—Toniae M. Thomas
(74) *Attorney, Agent, or Firm*—Miles & Stockbridge P.C.

(57) ABSTRACT

In a channel region between the source/drain diffusion layers, impurities of the same conductivity type as the well are doped in an area apart from the diffusion regions. By using as a mask the gate formed in advance, tilted ion implantation in opposite directions is performed to form the diffusion layers and heavily impurity doped region of the same conductivity type as the well in a self-alignment manner relative to the gate.

6 Claims, 25 Drawing Sheets

NONVOLATILE SEMICONDUCTOR MEMORY DEVICE AND MANUFACTURING METHOD THEREOF

CROSS-REFERENCE TO RELATED APPLICATION

This application is a division of application Ser. No. 10/166,145 filed Jun. 11, 2002 now U.S. Pat. No. 6,670,671.

BACKGROUND OF THE INVENTION

The present invention relates to a nonvolatile semiconductor memory device and its manufacturing method, and more particularly to techniques of realizing high integration and reliability of a nonvolatile semiconductor memory device capable of electrical programming.

Of electrically programmable nonvolatile semiconductor memory devices, a bulk erasable memory or so-called flash memory is known. Flash memories provide excellent portability and shock resistance and are electrically bulk erasable. For these reasons, demands for flash memories as storage devices of compact portable information apparatuses such as portable personal computers and digital still cameras are rapidly increasing. Reduction in a bit cost by a smaller memory cell area is an important factor for market expansion. Various memory cells realizing this have been proposed, for example, as described in "Ohyo Butsuri (or Applied Physics)", Vol. 65, No. 11, pp. 1114–1124 published by the Japan Society of Applied Physics on Nov. 10, 1996 (hereinafter called "Document 1").

A virtual ground type memory cell utilizing a three-layer polysilicon gate is described, for example, in JP-B-2694618 (registered on Sep. 12, 1997) corresponding to U.S. Pat. No. 5,095,344. This memory cell is constituted of semiconductor regions formed in a well of a semiconductor substrate and three gates. The three gates include a control gate formed on the well and an erase gate formed between the control gate and a floating gate disposed near each other. These three gates are made of polysilicon and are separated by insulator films. The floating gate and well are also separated by an insulator film. The control gate extending in the row direction constitutes a word line. The source/drain diffusion regions are formed along the column direction and are of a virtual ground type that shares the diffusion regions with adjacent memory cells. With this layout, a pitch in the row direction can be reduced. The erase gate is parallel to the channel and disposed between and in parallel to the word lines (control gates). In writing data in a memory cell described in Document 1, independent positive voltages are applied to the word line and drain, and 0 V is applied to the well, source and erase gate. Hot electrons are therefore generated in the channel region near the drain so that electrons are injected into the floating gate and the threshold voltage of the memory cell rises. In erasing data in the memory cell, a positive voltage is applied to the erase gate, and 0 V is applied to the word line, source, drain and well. Electrons are drained from the floating gate into the erase gate so that the threshold voltage lowers.

A split-gate type memory cell is disclosed, for example, in JP-A-9-321157 (laid open on Dec. 12, 1997). In this memory cell, a large overlap is formed between a diffusion layer and a floating gate to raise the floating gate potential by the diffusion layer potential and apply a low voltage to the word line. In this manner, the efficiency of generating and injecting hot electrons during data write can be improved.

A method of controlling the floating gate potential by the word line and controlling the split channel by a third gate different from the floating and control gates is discussed, for example, in the "Technical Digest" at the International Electron Devices Meeting, 1989, pp. 603–606.

SUMMARY OF THE INVENTION

The channel length is becoming shorter as the flash memory size reduces. A tradeoff between the breakdown voltage between a diffusion layer and a well and punch-through between a source and a drain becomes an important issue, regardless of the type of a memory cell.

The breakdown voltage between the diffusion layer and well is always required to be about 5V or higher during the write operation for the following reason.

For example, in the cell of the type that data is written by hot electron injection, about 12 V is applied to the control gate and about 5 V or higher is applied to the drain to generate channel hot electrons by utilizing a potential difference between the drain and the source applied with 0 V. The breakdown voltage between the drain and source is required to be the drain voltage or higher.

In the cell of the type that data is written by Fowler-Nordheim tunneling electron injection into the whole channel region, for example, about 18 V is applied to the control gate above the floating gate and 0 V is applied to the source/drain to write data by a tunnel current from the inversion layer to the floating gate. In this case, it is necessary to inhibit data write to other cells of the memory array having the same control gate. To this end, for example, about 5 V or higher is applied to the drains of the data write inhibited cells to float the sources so that the inversion channels having the same potential as the drains can be formed under the floating gates. In this manner, the potential difference between the floating gate and well can be reduced and electron tunneling from the channel to the floating gate can be prevented. In this case, the breakdown voltage between the diffusion layer and well is required to be the drain voltage or higher.

In the cell of the type that data is written by electron emission into the diffusion layer, about −12 V is applied to the control gate of a write cell, about 5 V is applied to the diffusion layer, and 0 V is applied to the well to drain electrons in the floating gate into the diffusion layer to write data. In this case, the breakdown voltage between the diffusion layer and well is required to be the drain voltage or higher. For the write inhibited cell having the same control gate as the write cell, 0 V is applied to the diffusion layer to relax the potential difference between the floating gate and diffusion layer.

As above, the breakdown voltage between the diffusion layer and well is required to be about 5 V or higher.

In a flash memory, when data is read, the threshold voltage of a memory cell is checked by generating a potential difference of about 1 V between the source and drain. It is a requisite that this source-drain voltage will not generate punch-through. Other conditions for preventing punch-through must be satisfied depending on the type of a cell.

For example, in the cell of a hot electron injection type, the memory array has cells having the same drain and source as the write cell or has cells having sources and drains respectively being connected by wiring layers. Such a cell is applied with the same drain voltage and source voltage as the write cell. This cell is generally inhibited to write data. If data write throughput is to be improved by parallel programming of a plurality of memory cells within the current drivability of a power source in the chip, it is necessary to prevent leak current between the source and drain of write inhibited cells. It is therefore necessary to prevent punch-through at the source/drain voltage of about 5 V or higher during hot electron injection.

There is another case of a cell called a virtual ground type cell. In the cell of this type, isolation is performed by using a select gate, control gate or the like. As described earlier, in the data write not utilizing injection, a voltage of about 5 V or hither is applied to the diffusion layer. Isolation of the virtual ground type cell from the voltage of about 5 V or higher applied to the diffusion layer is performed by using the control gate or the like. It is therefore necessary to prevent punch-through relative to the diffusion layer.

Low resistance to punch-through between the source and drain to be caused by a short channel has been avoided by implanting ions in the whole channel region and raising the impurity concentration of the channel region. With this method, however, the impurity concentration of a portion of the channel region in contact with the diffusion layer is raised so that the breakdown voltage is lowered.

According to an embodiment of the invention, a nonvolatile semiconductor memory device is provided which has memory cells each comprising: a well of a first conductivity type formed in a semiconductor substrate; a pair of semiconductor regions of a second conductivity type formed in the well of the first conductivity type, the pair of semiconductor regions being used as a source and a drain; a first gate formed on the semiconductor substrate via a first gate insulator; a second gate formed on a second insulator film covering the first gate; and a third gate formed via the second insulator film relative to the first gate and via a third insulator film relative to the second gate, wherein an impurity doped region of the first conductivity type having an impurity concentration higher than the well is formed in a channel region between the pair of semiconductor regions, the impurity doped region being not in contact with the semiconductor regions.

According to this embodiment, the impurity region having a higher impurity concentration than the well can prevent punch-through. This impurity region having a high impurity concentration is not in contact with the source/drain so that the breakdown voltage is not degraded.

According to another embodiment of the invention, a nonvolatile semiconductor memory device is provided which has memory cells each comprising: a semiconductor substrate having at least a first conductivity type region on a principal surface of the semiconductor substrate; a pair of semiconductor regions of a second conductivity type formed in the first conductivity type region, the pair of semiconductor regions being used as a source and a drain; a first gate formed above a channel region between the semiconductor regions via a first insulator film; and a second gate formed on the first gate via a second insulator film, wherein in a partial area of the channel region, a heavily impurity doped region of the first conductivity type is formed having a higher impurity concentration than the first conductivity type region, and the heavily impurity doped region is spaced from any one of the semiconductor regions.

Similar to the previously described embodiment, also in this embodiment, the heavily impurity doped region can prevent punch through without lowering the breakdown voltage. In each of the embodiments, punch-through can be more reliably prevented by continuously forming the impurity region having a high impurity concentration along the channel width direction or by forming the impurity region deeper than the source/drain.

According to another embodiment, a manufacturing method for a nonvolatile semiconductor memory device is provided which comprises: a step of forming a well of a first conductivity type in a semiconductor substrate; a step of forming a pair of semiconductor regions of a second conductivity type formed in the well of the first conductivity type, the pair of semiconductor regions being used as a source and a drain; a step of forming a first gate on the semiconductor substrate via a first gate insulator; a step of forming a second gate on a second insulator film covering the first gate; and a step of forming an impurity doped region of the first conductivity type having an impurity concentration higher than the well in a channel region between the pair of semiconductor regions, the impurity doped region being not in contact with the semiconductor regions. The semiconductor regions and the impurity region are formed in a self-alignment manner by tilted ion implantation tilted in opposite directions from a normal of the semiconductor substrate, by using the first gate as a mask.

According to this embodiment, the nonvolatile semiconductor memory device can be manufactured by changing only some of the processes without particular photoresist masks.

According to another embodiment of the invention, a manufacturing method for a nonvolatile semiconductor memory device, is provided which comprises: a step of forming dummy gates on a semiconductor substrate having a first conductivity type region on a surface thereof; a step of forming a pair of source/drain diffusion layers of a second conductivity type in a surface layer of the semiconductor substrate between adjacent dummy gates, by using the dummy gates as a mask; a step of burying the dummy gates with a first insulator film; a step of removing a portion of the first insulator film to expose an upper surface of each dummy gate without exposing the surface of the semiconductor substrate; a step of removing the dummy gates; a step of depositing a silicon nitride film or a polysilicon film on an upper surface of the first insulator film and an inner surface of a groove formed in the first insulator film by removing each dummy gate, to the extent that the groove is not completely buried; a step of etching back the silicon nitride film or the polysilicon film to form side walls on an inner surface of each groove; and a step of implanting impurities of the first conductivity type to form a heavily impurity doped region having an impurity concentration higher than the first conductivity type region in the surface layer of the semiconductor substrate between the pair of source/drain diffusion layers, by using the first insulator film and the side walls as a mask.

According to this embodiment, the heavily impurity doped region not in contact with the source/drain can be formed efficiently even for a stacked-type memory cell in which a pair of source/drain regions is formed in surface layers of the semiconductor substrate sandwiching the floating gate. The side walls on the inner surface of the groove are not necessarily required to be formed, but after the deposition step the heavily impurity doped region may be formed by implanting impurity ions of the first conductivity type at an energy allowing the impurity ions to transmit through the silicon nitride film or polysilicon film on the bottom of the groove. In this case, the step of etching back the side walls can be omitted so that processes can be simplified. If not the silicon nitride film but the polysilicon film is used, this polysilicon film can be used later as the floating gate so that processes can be simplified more.

Other objects, features and advantages of the invention will become apparent from the following description of the embodiments of the invention taken in conjunction with the accompanying drawings.

BRIEF DESCRIPTION OF THE DRAWINGS

FIG. 7A shows the voltage conditions during data read, and FIG. 7B shows the voltage conditions during data write.

FIG. 19A shows the voltage condition during data read, and FIG. 19B shows the voltage conditions during data write.

DESCRIPTION OF THE EMBODIMENTS

Figure 1:
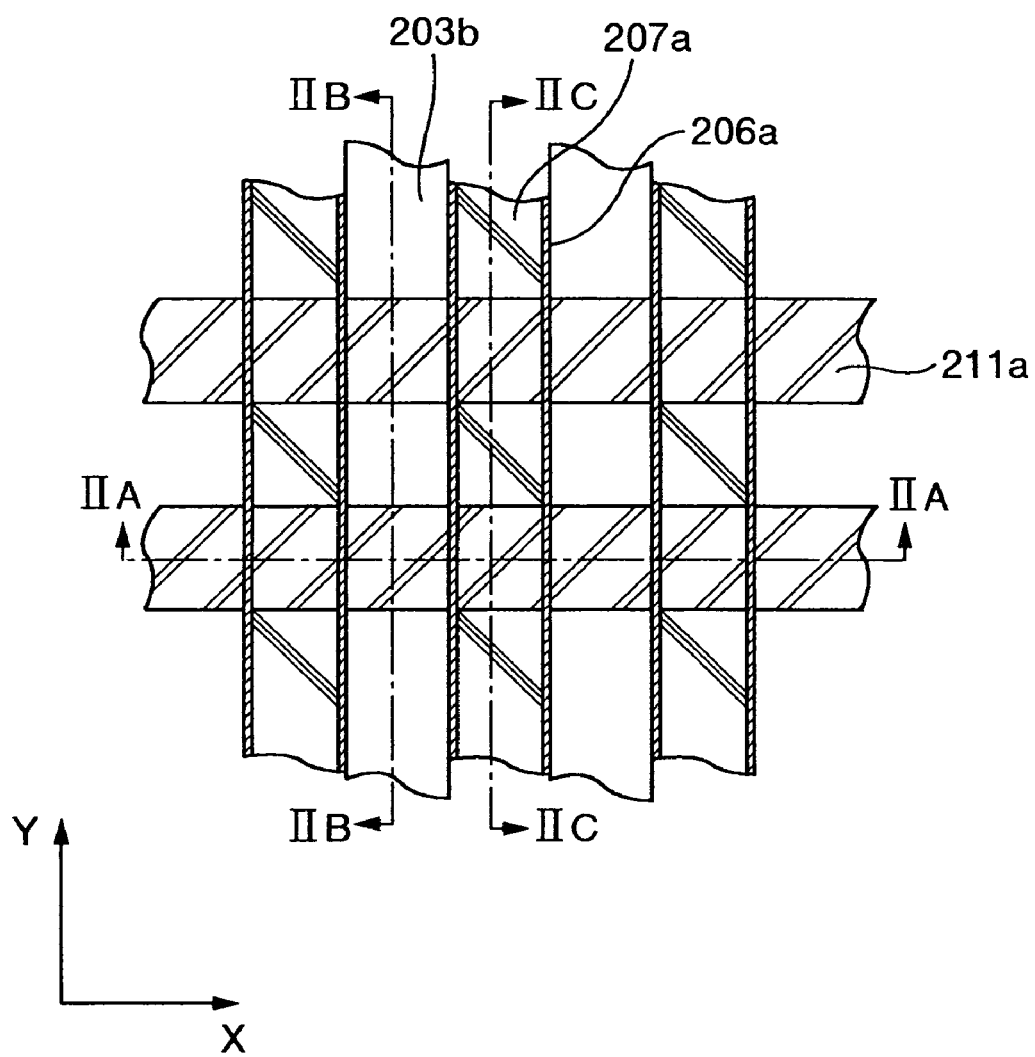
FIG. 1 is a partial plan view showing an example of a nonvolatile semiconductor memory device according to a first embodiment of the invention.

Embodiments of the invention will be described in detail with reference to the accompanying drawings. In all of the drawings, elements having the same function are represented by identical reference numerals and the duplicated description thereof is omitted.

First Embodiment

Figure 2A:
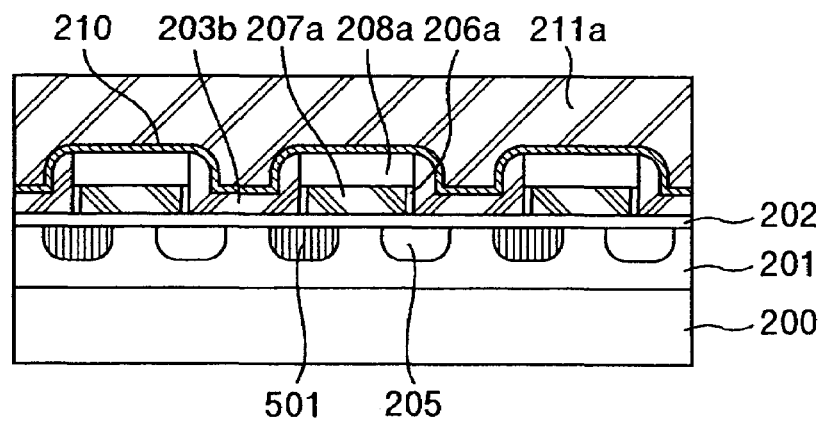
FIGS. 2A to 2C are cross sectional views respectively taken along lines IIA—IIA, IIB—IIB and IIC—IIC shown in FIG. 1.
Figure 2B:
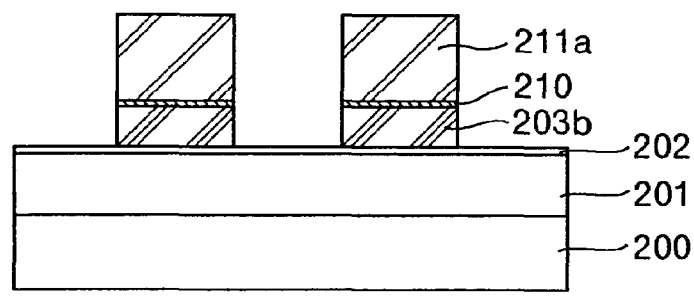
Figure 2C:
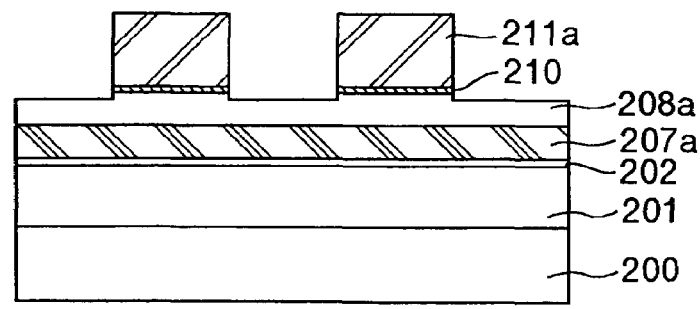

FIG. 1 is a partial plan view showing an example of a nonvolatile semiconductor memory device according to a first embodiment of the invention. FIGS. 2A to 2C are cross sectional views respectively taken along lines IIA—IIA, IIB—IIB and IIC—IIC shown in FIG. 1. In the plan view of FIG. 1, some elements are omitted in order to make it easy to clarify the drawing.

The nonvolatile semiconductor memory device of this embodiment has memory cells of a so-called flash memory. The memory cell has a source/drain diffusion layers, a first gate (floating gate) 203b, a second gate (control gate) 211a and a third gate 207a, respectively formed in a well 201 formed in the principal surface layer of a semiconductor substrate 200. In a channel region sandwiched between the source/drain diffusion layers, a semiconductor region 501 is formed which has a higher impurity concentration than the other regions of the well 201. This heavily impurity doped region 501 prevents punch-through between the source and drain to be caused by a short channel. Although the breakdown voltage between the well and the source/drain diffusion layers is also required to be sufficient, this can be realized because the heavily impurity doped region 501 is formed not in contact with the source/drain diffusion layer. If conventional implantation of the whole channel region is performed at a low impurity concentration, the breakdown voltage between the diffusion layer and well is sufficient. It can be known from this that if the impurity concentration of the well in contact with the diffusion layer is equal to or lower than that of conventional implantation of the whole channel region, the breakdown voltage is sufficient.

The control gate (second gate) 211a of each memory cell extends in the row direction (x-direction) and constitutes the word line WL. The floating gate (first gate) 203b and well 201 are separated by a gate insulator film (first insulator film) 202, the floating gate 203b and third gate 207a are separated by an insulator film (third insulator film) 206a, the floating gate 203b and word line (control gate) 211a are separated by an insulator film (second insulator film) 210, and the third gate 207a and word line 211a are separated by an insulator film (fourth insulator film) 208a.

The source/drain diffusion layer 205 extends in the direction (y-direction) perpendicular to the extension direction (x-direction) of the word line 211a. The source/drain diffusion layers 205 function as a local source line and a local data line interconnecting the sources and drains of memory cells in the column direction (y-direction). Namely, the nonvolatile semiconductor memory device of this embodiment has no contact hole of each memory cell and is made of a so-called contactless array. Each channel is formed in the direction (x-direction) perpendicular to the diffusion layer 205. In the channel region, the heavily impurity doped region 501 is disposed along the source/drain diffusion layer 205 to prevent punch-through between the source and drain.

Two edges of the third gate 207a face via the insulator films 206a two edges of the floating gates 203b perpendicular to the word line 211a and channel.

The third gate 207a is buried in a gap between the floating gates 203b extending in the direction (y-direction) perpendicular to the word line 211a and channel. The floating gates 203b are symmetrical to the third gate 207a, and the third gates 207a are symmetrical to the floating gate 203b.

In this embodiment, a pair of diffusion layers 205 constituting the sources/drains is asymmetrical to the floating gate pattern 203b, and one diffusion layer has an off-set structure not overlapping the floating gate. Also in this embodiment, the third gate 207a and diffusion layer 205 overlap partially. In this embodiment, therefore, the channel is also formed in the well under the third gate 207a, and the third gate 207a functions as the gate for controlling the channel under the third gate 207a. Namely, the memory cell constitutes a split-gate type transistor having the first and third gates.

Figure 7A:
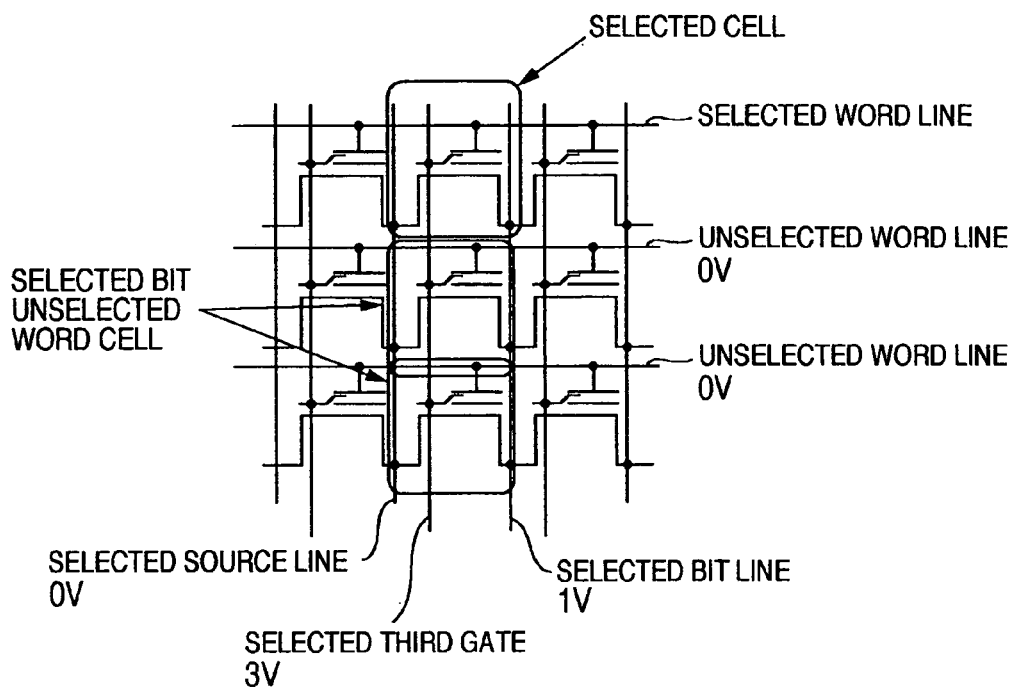
FIGS. 7A and 7B are schematic circuit diagrams of a memory array of the first embodiment.

When data is read, a voltage of about 3 V is applied to the third gate to form the channel under the third gate 207a, and a voltage is applied to the word line corresponding to the bit to be selected. Under these conditions, the threshold voltage of the memory cell is checked. During this operation, as shown in FIG. 7A, it is necessary not to flow current between the sources and drains of selected bit-unselected word cells connected in parallel to the selected bit. Since the channel is formed under the third gate, it is a requisite that current will not flow under the first gate. Namely, punch-through under the first gate is not permitted.

Figure 7B:
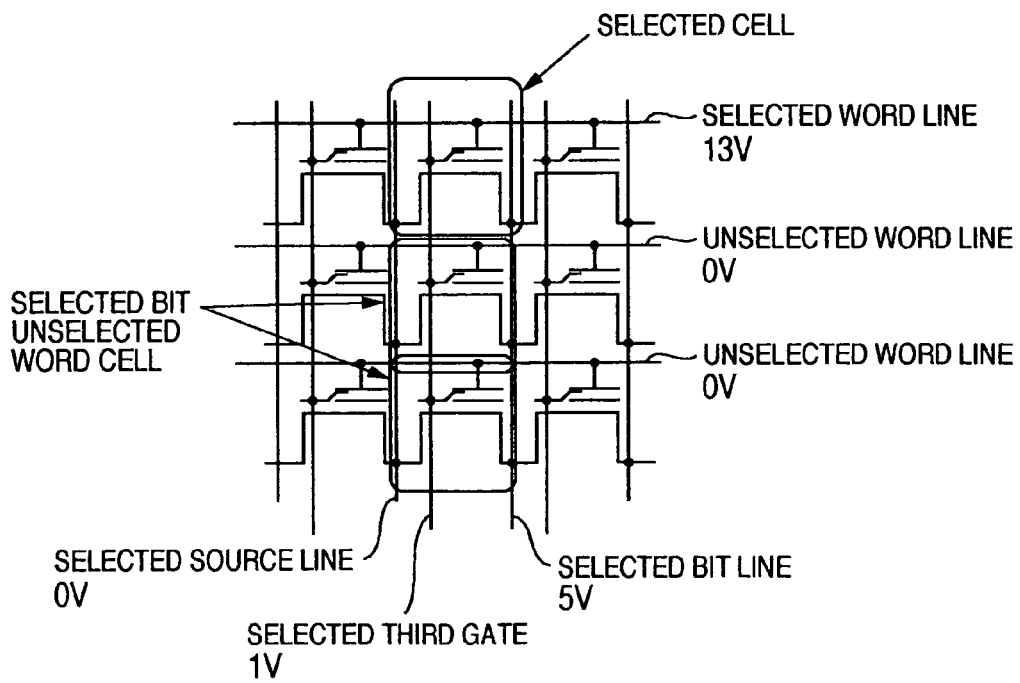

When data is written, as shown in FIG. 7B about 13 V is applied to the control gate of the cell to be selected, about 5 V is applied to the drain, and about 1 V is applied to the third gate, and 0 V is applied to the source and well. Under these conditions, a channel is formed under the third gate 207a and hot electrons are generated in the channel near the edge of the floating gate on the source side and injected into the floating gate. In this operation, if data write throughput is to be improved by parallel programming of a plurality of memory cells within the current drivability of a power source in the chip, it is necessary to prevent current from flowing through the sources and drains of selected bit-unselected word cells. Since the channel is formed under the third gate, it is necessary not to flow current under the first gate. It is also a requisite that punch-though will not occur under the first gate.

In this embodiment, the array structure is of the virtual ground type so that the third gate provides also the isolation function. Both in the data write (program) and data read, the isolation of a selected cell from a cell adjacent to the drain relies upon the channel under the third gate near the drain. It is therefore essential to prevent punch-through under the third gate.

For the above reasons, it is essential to prevent punch-through both under the first and third gates. Since the region 501 is formed extending under both the first and third gates, it is possible to prevent punch-through.

In this embodiment, the third gate may be used as an erase gate for draining electrons from an adjacent floating gate when data is erased.

FIGS. 3A–3C, 4A–4C, and 5A–5D are cross sectional views illustrating an example of a method of manufacturing a nonvolatile semiconductor memory device according to the first embodiment.

Figure 3A:
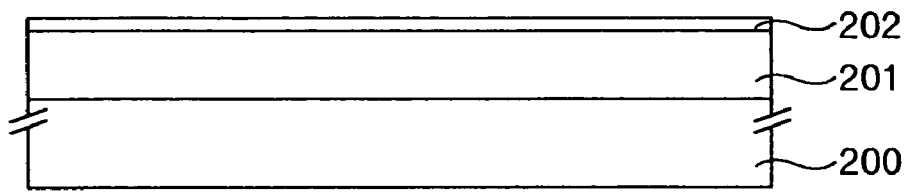
FIGS. 3A to 3C are cross sectional diagrams illustrating an example of a method of manufacturing a nonvolatile semiconductor memory device according to the first embodiment.

First, a well 201 of a p-type (first conductivity type) is formed in a semiconductor substrate 200. On this well 201, a gate insulator film (first insulator film) 202 of about 10 nm in thickness is formed, for example, by a thermal oxidation method (FIG. 3A).

Figure 3B:
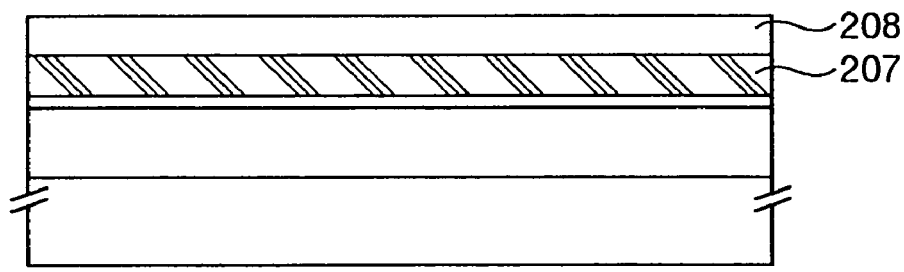

Next, a polysilicon film 207 doped with phosphorus (P) to be used as a third gate 207a and a silicon oxide film 208 are sequentially deposited (FIG. 3B). For example, chemical vapor deposition (CVD) is performed for depositing the polysilicon film 207 and silicon oxide film 208.

Figure 3C:
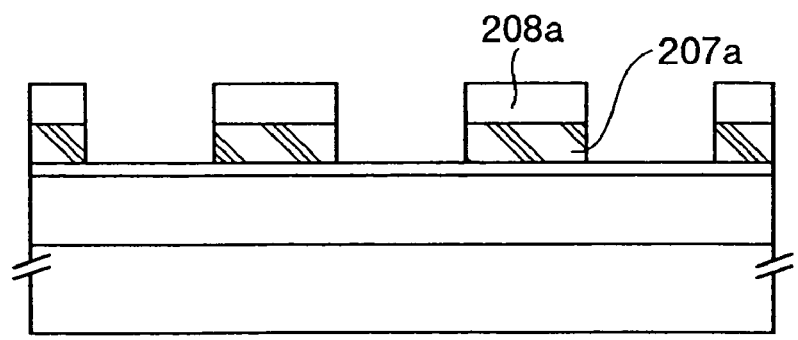

Next, the silicon oxide film 208 and polysilicon film 207 are patterned by lithography and dry etching techniques to form a pattern of a silicon oxide film 208a and a polysilicon film 207a (FIG. 3C). The silicon oxide film 208a and polysilicon film 207a are patterned so that they extend in the y-direction in the stripe shape.

Figure 4A:
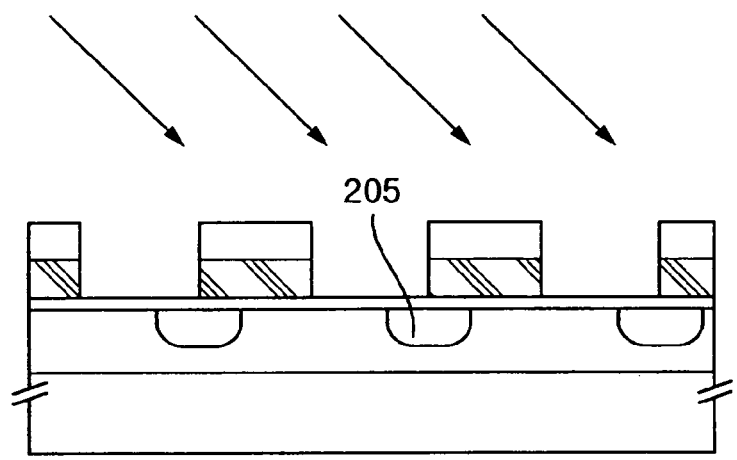
FIGS. 4A to 4C are cross sectional diagrams illustrating the method of manufacturing a nonvolatile semiconductor memory device according to the first embodiment.

Thereafter, arsenic (As) ions are implanted into the well 201 through tilted ion implantation (FIG. 4A). Diffusion layers 205 function as source lines or data lines of memory cells. During this tilted ion implantation, the silicon oxide film 208a and polysilicon film 207a function as a mask so that the diffusion layer 205 can be formed in a self-alignment manner relative to the polysilicon layer 207a. Since the silicon oxide film 208a and polysilicon film 207a are formed along the y-direction in a stripe shape, the diffusion layer 205 is formed extending in the y-direction. Since the diffusion layer 205 is formed by tilted ion implantation, irradiated ions are shaded by the silicon oxide film 208a and polysilicon film 207a and ions are not implanted into the whole region between the polysilicon films 207a. Since ions are implanted in a slanted direction, the diffusion layer 205 is formed also in the partial region under the polysilicon film 207a. Therefore, as described earlier, the third gate 207a and diffusion layer 205 are formed being partially overlapped. The channel is also formed in the well 201 under the third gate 207a.

Figure 4B:
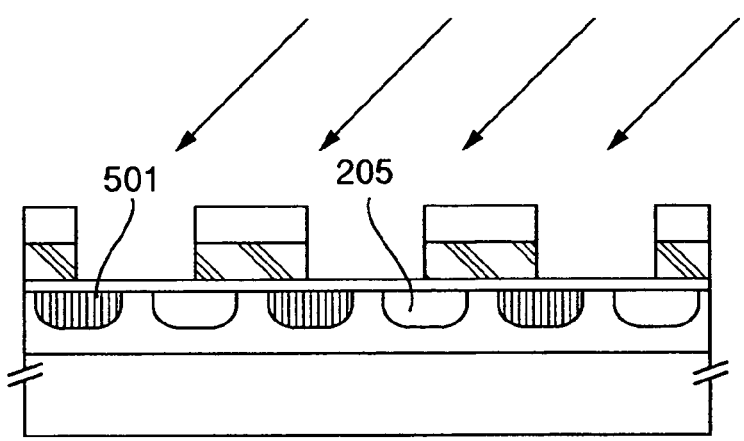

Next, boron (B) ions or boron fluoride ($BF_2$) ions are implanted into the well 201 by tilted ion implantation to form heavily impurity doped regions 501 (FIG. 4B). The direction of tilted ion implantation is opposite to that used for forming the diffusion layer shown in FIG. 4A. The region 501 improves the resistance to punch-through between a source and drain. During this ion implantation, the silicon oxide film 208a and polysilicon film 207a function as a mask so that the heavily impurity doped region 501 can be formed in a self-alignment manner relative to the polysilicon film 207a. Since the silicon oxide film 208a and polysilicon film 207a are formed extending in the y-direction in a stripe shape, the heavily impurity doped region 501 extends in the y-direction. Since the heavily impurity doped region 501 is formed by tilted ion implantation, irradiated ions are shaded by the silicon oxide film 208a and polysilicon film 207a and the heavily impurity doped region 501 is not formed in the whole region between the polysilicon films 207a. Since ions are implanted in a slanted direction, it is possible to make the diffusion layer 205 and heavily impurity doped region 501 not contact each other between the polysilicon films 207a. Therefore, as compared with not forming the heavily impurity doped region 501, the breakdown voltage between the diffusion layer and well is less degraded. Since the heavily impurity doped region 501 is formed by titled ion implantation, the heavily impurity doped region 501 is also formed in a partial region under the polysilicon film 207a. The resistance to punch-through in the regions under both the first and third gates can be improved. The order of forming the diffusion layer 205 and highly impurity doped region 501 may be reversed.

Figure 4C:
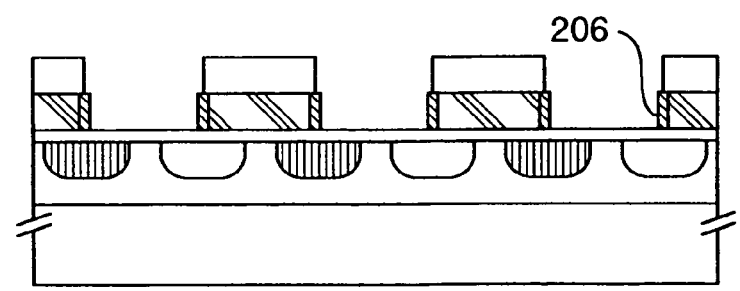

Next, a silicon oxide film 206 is formed for separating the third gate 207a and floating gate 203b. This silicon oxide film is formed through thermal oxidation of the polysilicon film 207a, through CVD or through a combination of both the thermal oxidation and CVD (FIG. 4C).

Figure 5A:
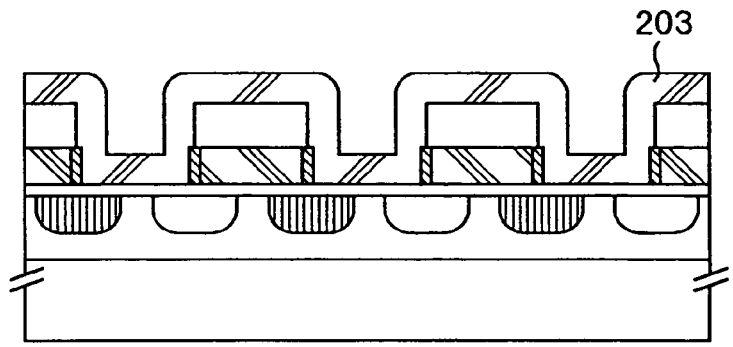
FIGS. 5A to 5D are cross sectional diagrams illustrating the method of manufacturing a nonvolatile semiconductor memory device according to the first embodiment.
Figure 5B:
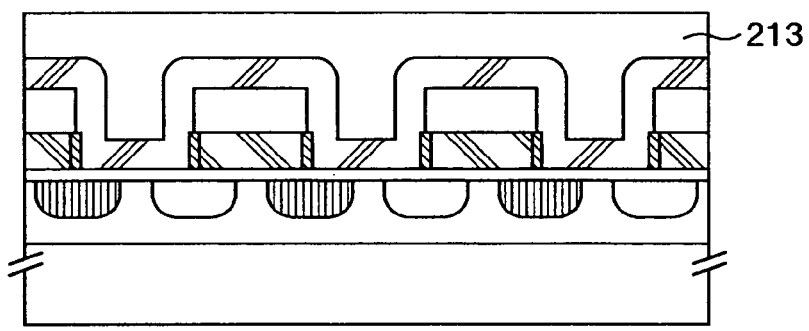

Thereafter, a polysilicon film 203 doped with phosphorus (P) to be used as the floating gate 203b is deposited to the extent that a groove of the polysilicon film 203 between the third gate patterns 207a is not completely filled with polysilicon (FIG. 5A).

Next, photoresist 213 is coated, filling the groove (FIG. 5B), and the photoresist and polysilicon film 203 are etched back to pattern the polysilicon film 203 to be used as the floating gate.

Figure 5C:
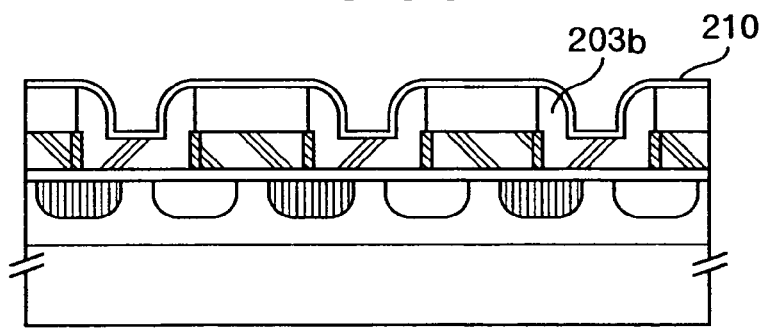

Next, an insulator film 210 for separating the floating gate and word line is formed (FIG. 5C). This insulator film may be a silicon oxide film or a stacked film of silicon oxide film/silicon nitride film/silicon oxide film.

Figure 5D:
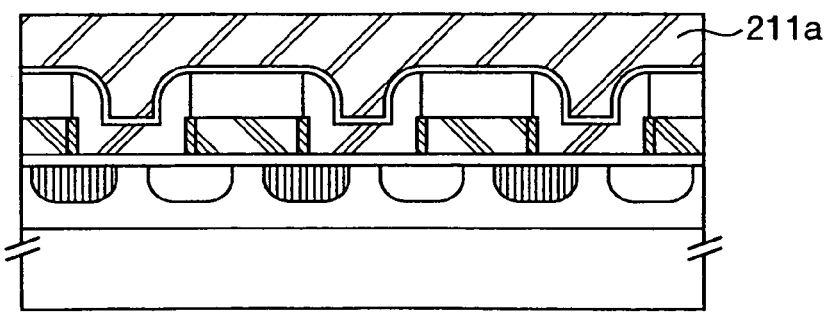

Next, a stacked film of polysilicon film/tungsten nitride film/tungsten film, or so called polymetal film 211, is deposited and patterned by well known lithography and dry etching techniques to from word lines. The silicon oxide film or stacked film 210 of silicon oxide film/silicon nitride film/silicon oxide film, and the polysilicon film 207a are sequentially etched to complete the floating gate (FIG. 5D).

Although not shown, after an interlayer insulating film is formed, contact holes are formed reaching the word line 211a, source/drain diffusion layers 205, well 201 and third gate 207a. A metal film is thereafter deposited and patterned to form metal wires and complete memory cells.

Figure 6:
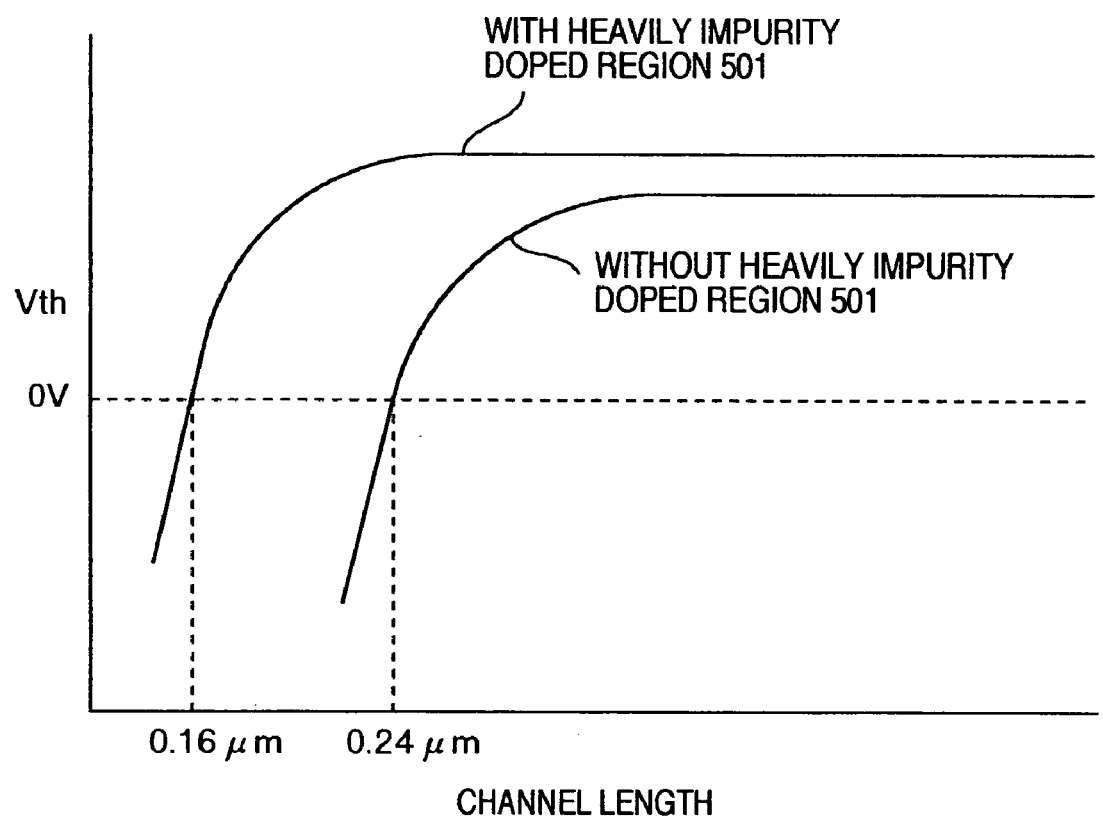
FIG. 6 is a graph showing the dependency of a neutral threshold voltage of memory cells upon a channel length and the effects of the nonvolatile semiconductor memory device according to the first embodiment.

FIG. 6 is a graph showing the channel length dependency of a neutral threshold voltage of memory cells of the nonvolatile semiconductor memory device manufactured by the above processes, respectively with and without the heavily impurity doped region 501. It can be seen from this graph that because of the provision of the heavily impurity doped region 501, the channel length is shortened from 0.24 μm to 0.16 μm which length ensures a positive threshold voltage and that the punch-through resistance is improved. The breakdown voltage between the diffusion layer and well did not change even if the heavily impurity doped region 501 is formed. Distinctive effects were confirmed relative to the main issue of a tradeoff between improvement of the punch-through resistance between a source and drain and retention of the breakdown voltage between the diffusion layer and well.

Second Embodiment

Figure 19A:
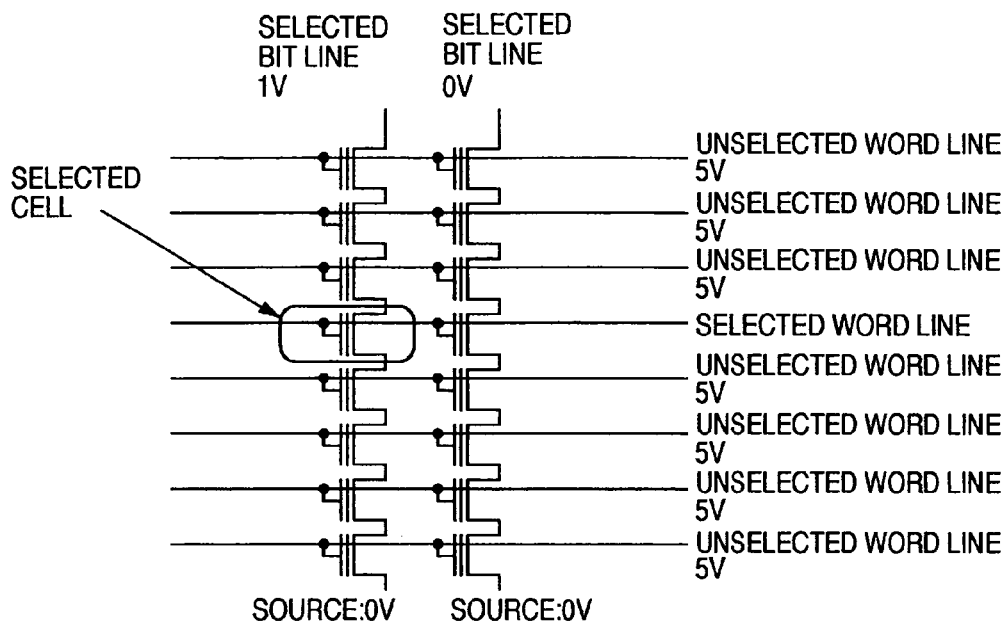
FIGS. 19A and 19B are schematic circuit diagrams of an NAND type flash memory array as a typical example of a static type memory array.
Figure 19B:
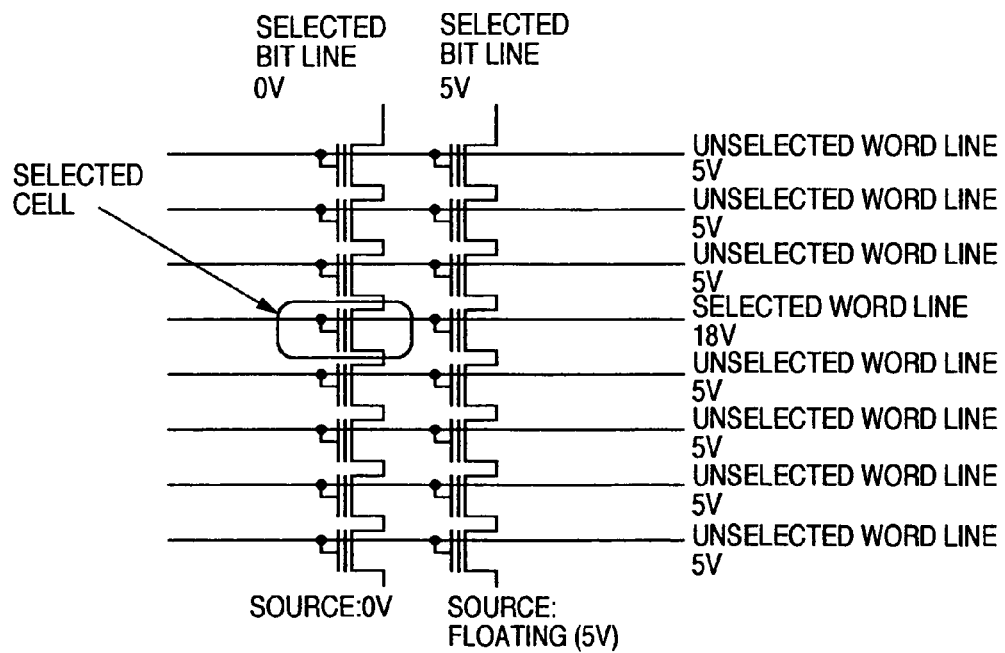
Figure 20:
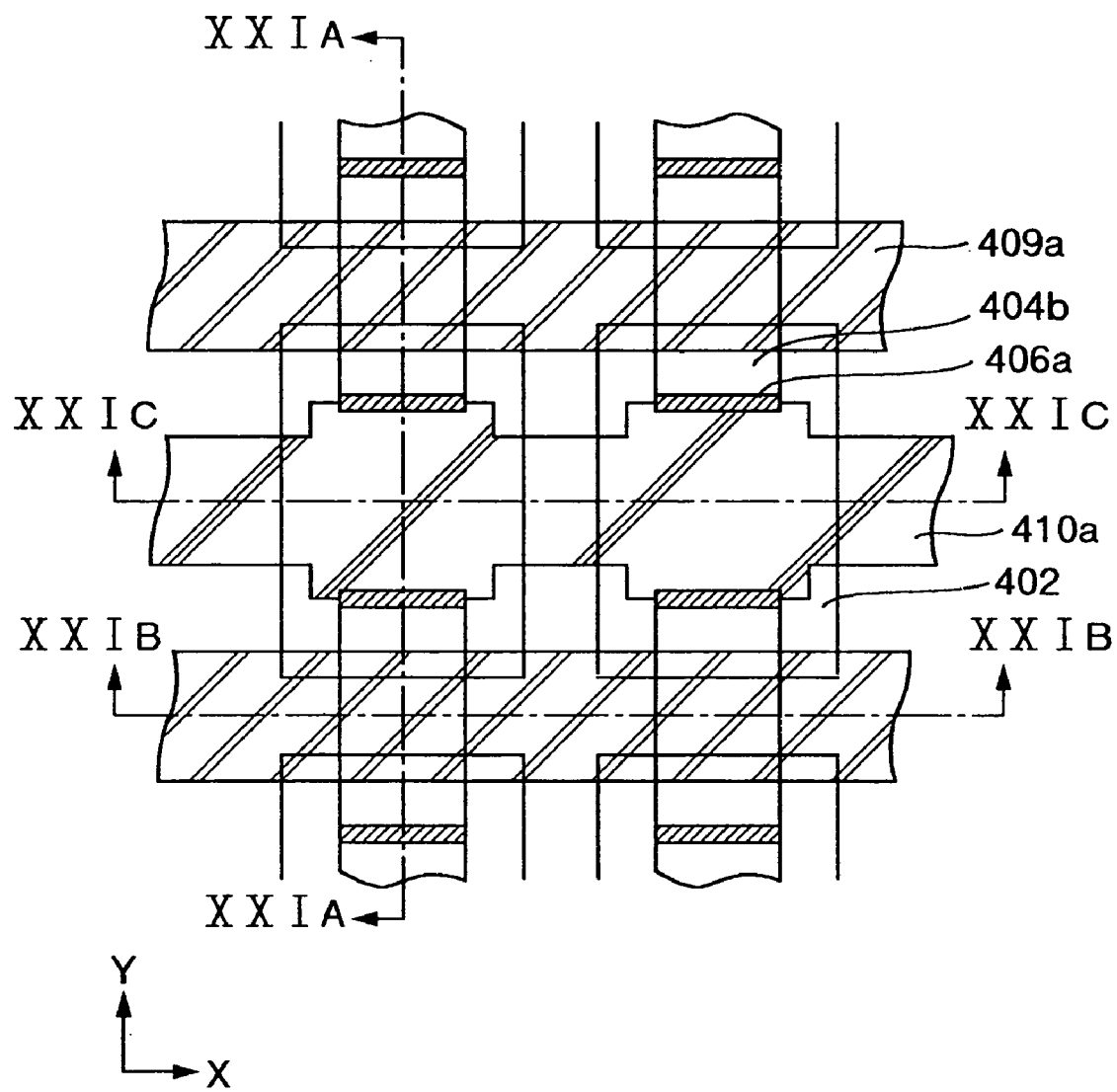
FIG. 20 is a partial plan view showing an example of a nonvolatile semiconductor memory device according to an eighth embodiment of the invention.

In the first embodiment, split-gate type memory cells are used by way of example. In the second embodiment, stacked type memory cells are used. FIGS. 19A and 19B are circuit diagrams of a so-called NAND type flash memory. Cells are serially connected. In reading data, a threshold voltage or higher is applied to the control gates of all selected bit-unselected word memory cells to allow current to flow. Under this condition, the threshold voltage of the selected cell is checked. It is necessary to prevent punch-through of the selected memory cell.

In writing data, i.e., in injecting electrons from the well into the floating gate, a voltage of about 5 V is applied to the diffusion layer of write inhibited cells on the word line to reduce the potential difference from that of the inversion channel under the floating gate and prevent electrons from being injected from the well into the floating gate.

The NAND type memory cell is also associated with the issue of a tradeoff between the prevention of punch-through to be caused by a short channel and the retention of breakdown voltage between a diffusion layer and well.

FIGS. 8A–8D, 9A–9C, 10A–10C, 11, 12A–12C, and 13A–13C are cross sectional views illustrating an example of a method of manufacturing a nonvolatile semiconductor memory device according to a second embodiment of the invention. In order to draw gates, source/drain diffusion layers, element separation silicon oxide films in a cross sectional view taken along one line, a so-called AND type memory cell will be described. The processes can be easily applied to other stacked type memory cells such as NAND type memory cells.

Figure 8A:
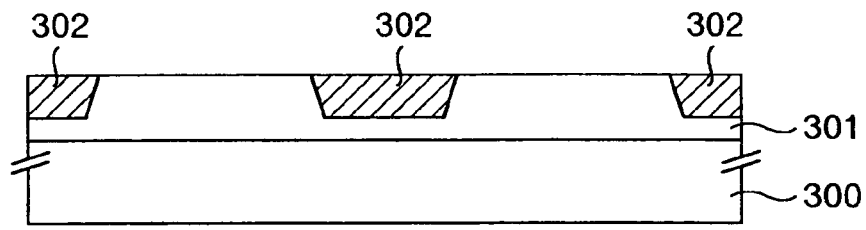
FIGS. 8A to 8D are cross sectional diagrams illustrating an example of a method of manufacturing a nonvolatile semiconductor memory device according to a second embodiment of the invention.
Figure 8B:
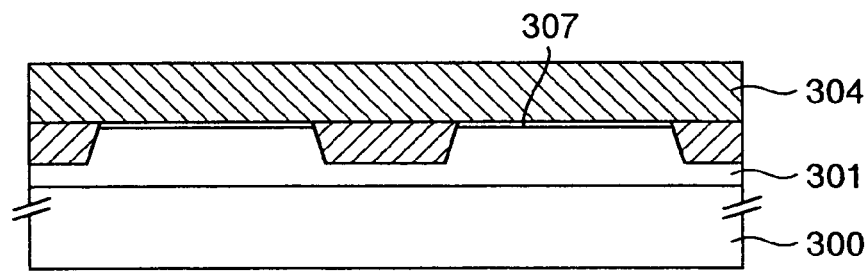
Figure 8C:
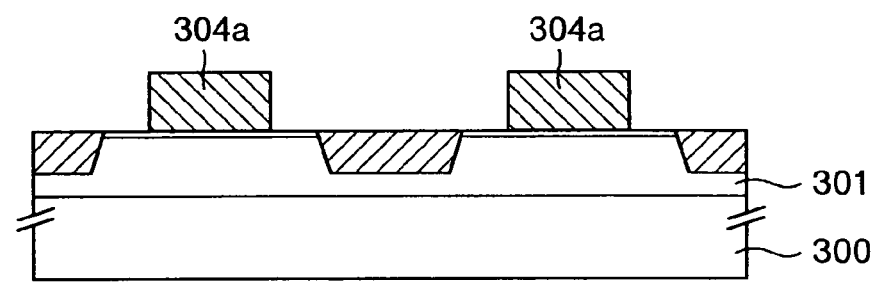
Figure 8D:
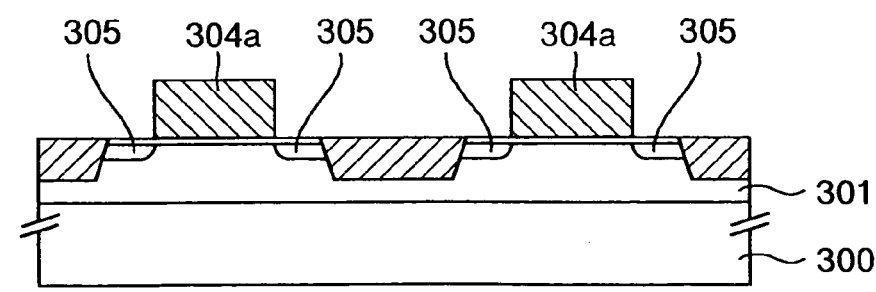

A p-type well 301 was formed in a silicon substrate 300, and a field oxide film 302 to be used as an element separation region was formed in the p-type well (FIG. 8A). Next, a silicon oxide film 307 was formed, for example, by a thermal oxidation method. A silicon nitride film or polysilicon film 304 was formed on the silicon oxide film, for example, by CVD (FIG. 8B). This silicon nitride film or polysilicon film 304 is used as a dummy gate for forming a gap in which a floating gate is formed at a later process. The silicon nitride film or polysilicon film 304 was patterned by lithography and dry etching techniques to form dummy gates 304a (FIG. 8C). Next, by using the dummy gate as a mask, arsenic ions were implanted to form source/drain diffusion layers 305 of each memory cell (FIG. 8D).

Figure 9A:
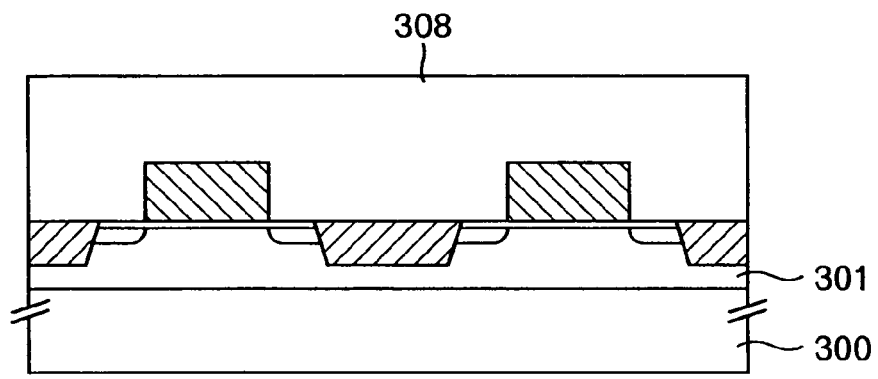
FIGS. 9A to 9C are cross sectional diagrams illustrating the method of manufacturing a nonvolatile semiconductor memory device according to the second embodiment.
Figure 9B:
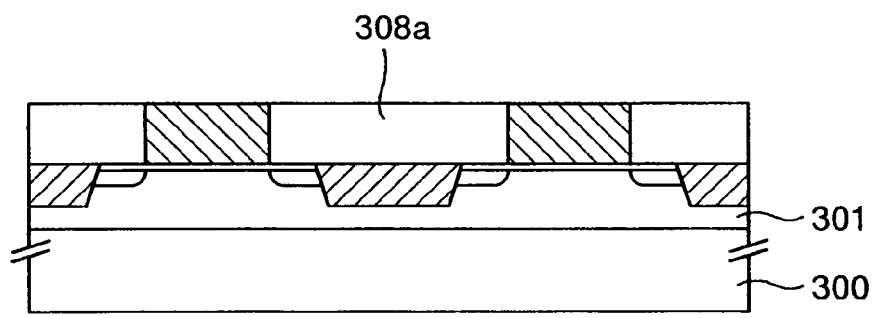
Figure 9C:
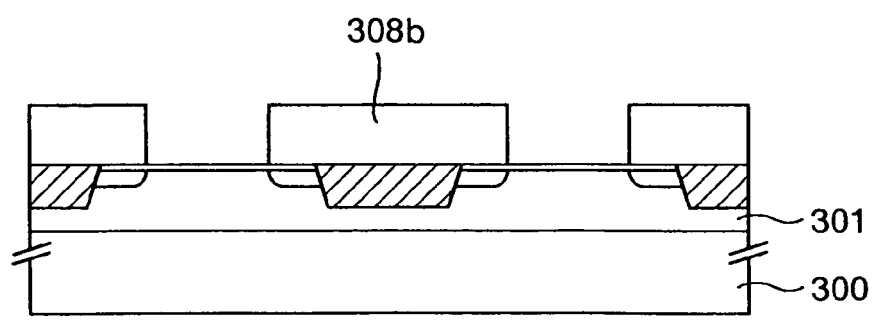

Next, a silicon oxide film 308 is deposited completely filling the gap between the dummy gates 304a, for example, by CVD (FIG. 9A). Next, the silicon oxide film 308 is worked to expose the upper surface of the dummy gate 304a, by a chemical mechanical polishing method or etch-back (FIG. 9B). Next, the exposed dummy gates 304a are removed by dry etching or wet etching to form a silicon oxide film pattern 308b and a gap above an area between the source/drain (FIG. 9C).

Figure 10A:
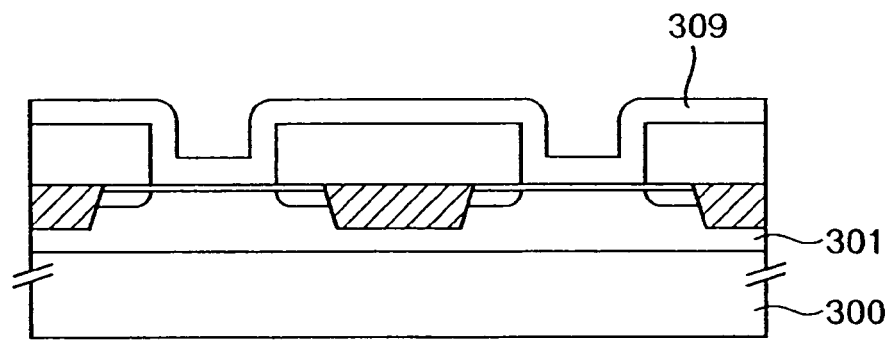
FIGS. 10A to 10C are cross sectional diagrams illustrating the method of manufacturing a nonvolatile semiconductor memory device according to the second embodiment.
Figure 10B:
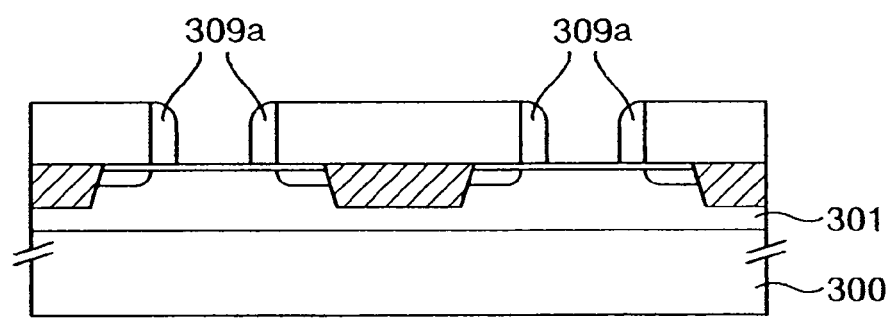
Figure 10C:
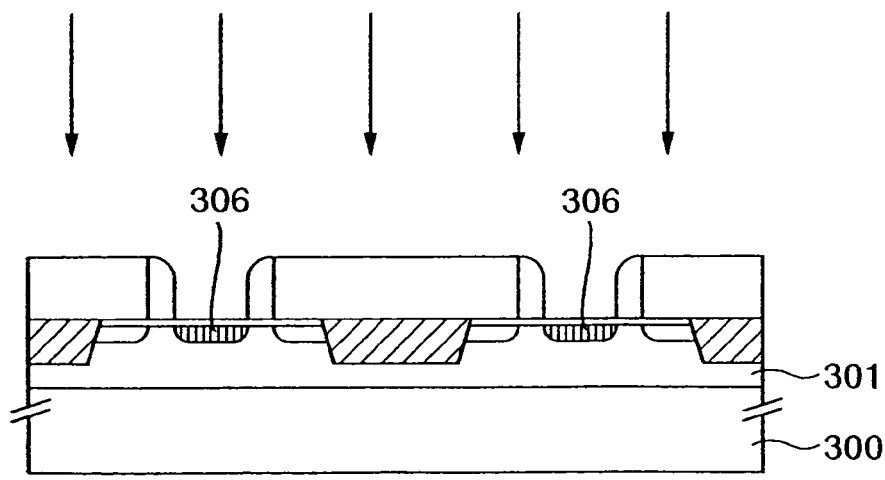

Next, a silicon nitride film or polysilicon film 309 is deposited to the extent that the gap is not completely filled with the film (FIG. 10A) and thereafter etched back to form side walls 309a (FIG. 10B). Next, by using the silicon oxide films 308b and side walls 309a as a mask, boron or boron fluoride ions are implanted vertically to form heavily impurity doped regions 306 (FIG. 10C). The diffusion layer 305 and heavily impurity doped region 306 can be spaced apart by a distance corresponding to the thickness of the side wall. The heavily impurity doped region 306 can improve the resistance to punch-through between the source and can retain the breakdown voltage between the diffusion layer and well.

Figure 11:
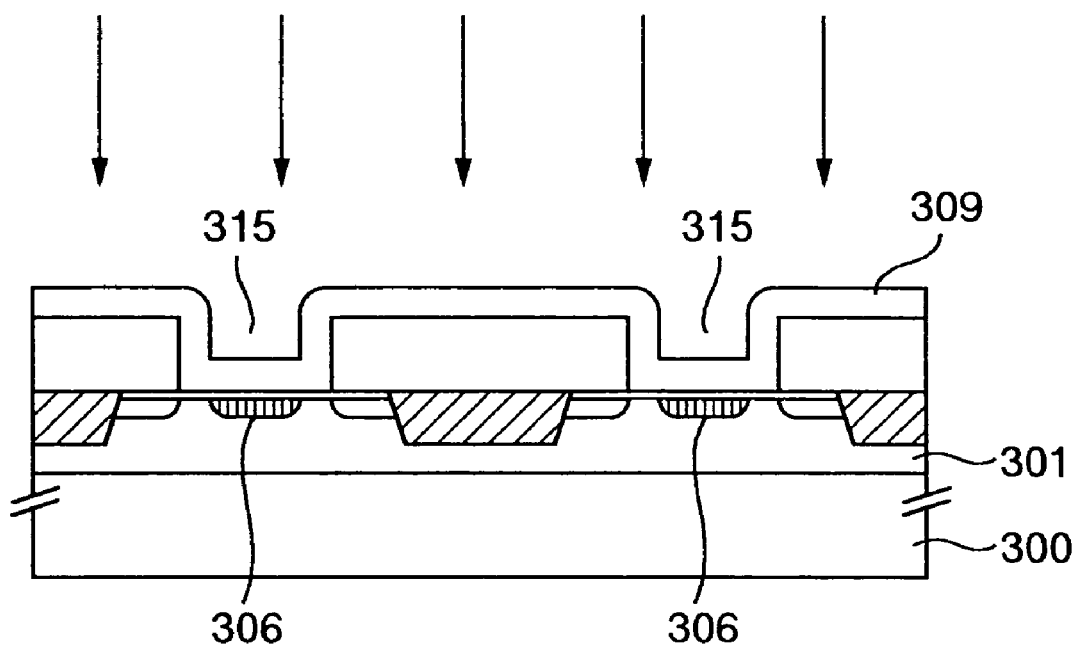
FIG. 11 is a cross sectional diagram illustrating the method of manufacturing a nonvolatile semiconductor memory device according to the second embodiment.

The heavily impurity doped region 306 may be formed by another method (FIG. 11). Namely, without etching back the silicon nitride film or polysilicon film 309, boron or boron fluoride ions are implanted vertically by positively utilizing the recess 315. In this case, in order to allow implanted ions to pass through the silicon nitride film or polysilicon film 309 and reach the well, it is necessary to perform ion implantation at a higher energy than when ion implantation is performed with the side walls. This method simplifies the processes more than if the side walls are formed.

Figure 12A:
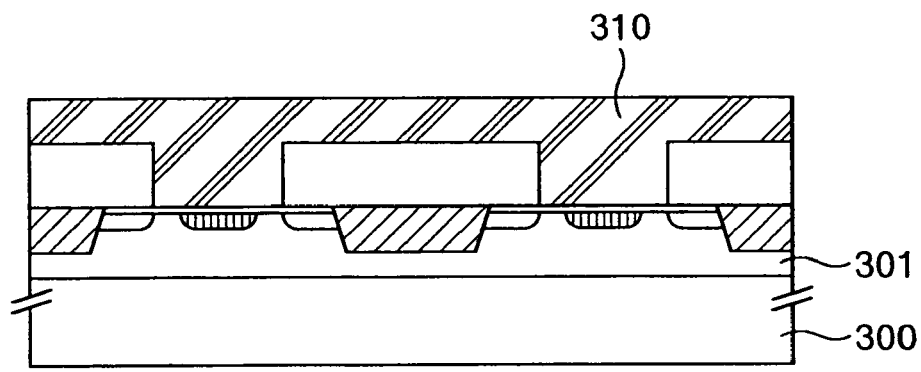
FIGS. 12A to 12C are cross sectional diagrams illustrating the method of manufacturing a nonvolatile semiconductor memory device according to the second embodiment.
Figure 12B:
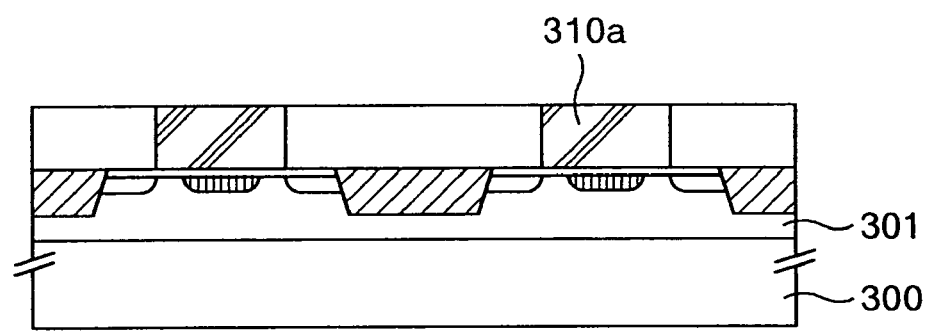
Figure 12C:
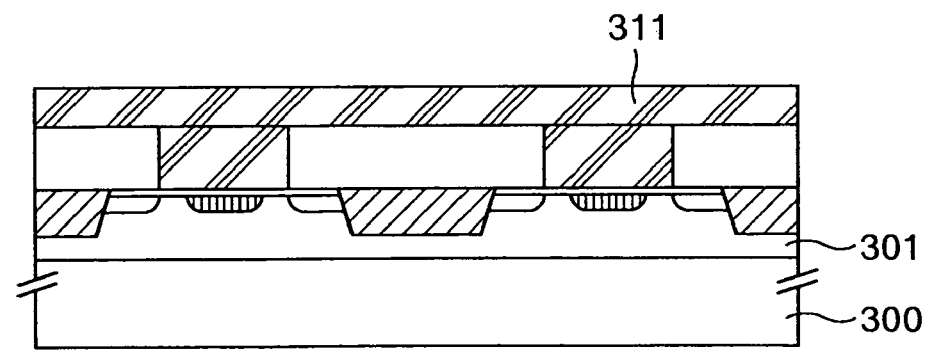

Next, the side walls 309a or deposited film 309 are removed, for example, by wet etching or isotropic dry etching. Thereafter, a polysilicon film 310 doped with phosphorus to be used as the floating gate is formed completely filling the gap (FIG. 12A). The polysilicon film 310 is removed until the oxide film pattern 308b is exposed by chemical mechanical polishing or etch-back (FIG. 12B). Next, a polysilicon film 311 doped with phosphorus is deposited (FIG. 12C).

Figure 13A:
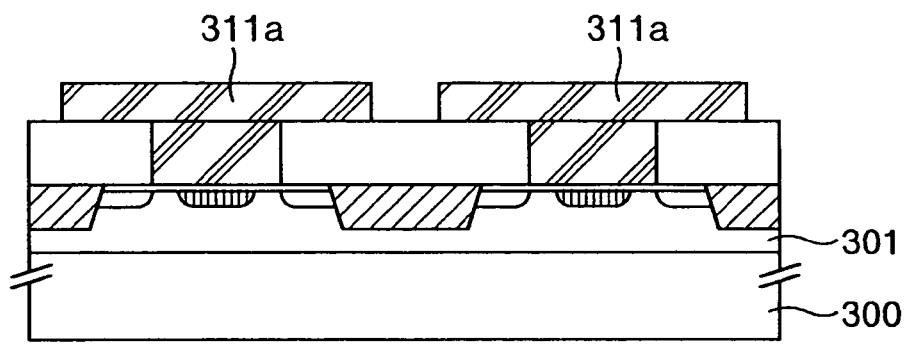
FIGS. 13A to 13C are cross sectional diagrams illustrating the method of manufacturing a nonvolatile semiconductor memory device according to the second embodiment.
Figure 13B:
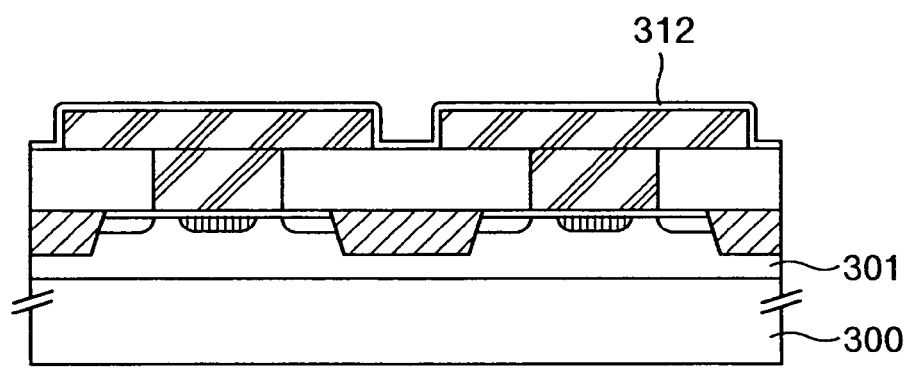
Figure 13C:
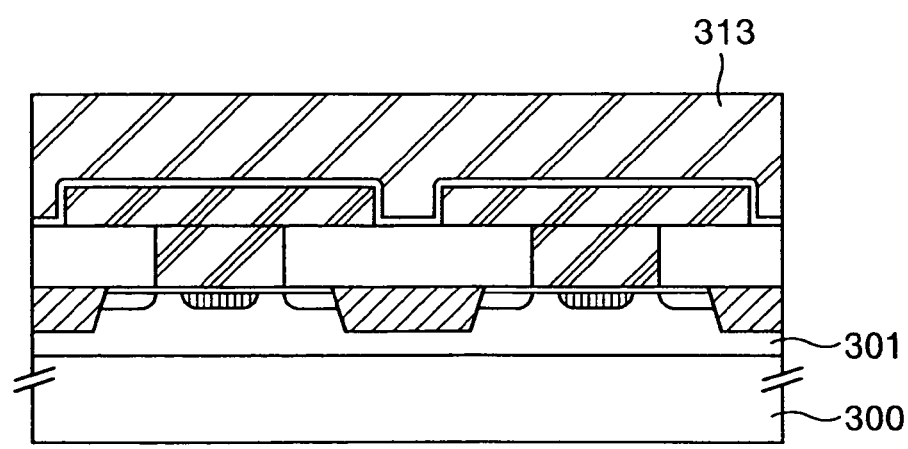

This polysilicon film 311 is patterned by using lithography and dry etching techniques to form floating gates 311a (FIG. 13A). Thereafter, an insulator film 312 is formed to separate the floating gate from the control gate (FIG. 13B). This insulator film may be a silicon oxide film or a stacked film of silicon oxide film/silicon nitride film/silicon oxide film. Next, a stacked film of polysilicon film/tungsten nitride film/tungsten film, or so called polymetal film 313, is deposited and patterned by well known lithography and dry etching techniques to form word lines. The silicon oxide film or stacked film 312 of silicon oxide film/silicon nitride film/silicon oxide film, the polysilicon film 311a and polysilicon film 310a are sequentially etched to complete the floating gate (FIG. 13C).

Although not shown, after an interlayer insulating film is formed, contact holes are formed reaching the word line 313, source/drain diffusion layers 305, and well 301. A metal film is thereafter deposited and patterned to form metal wires and complete memory cells.

Similar to the first embodiment, according to the memory cell of this embodiment, it was possible to retain the breakdown voltage between the diffusion layer and well while the resistance to punch-through between the source and drain is improved.

Third Embodiment

In the second embodiment, after the polysilicon film 310 doped with phosphorus to be used as the floating gate is deposited completely filling the gap (FIG. 12A), the polysilicon film 310 is worked by a chemical mechanical polishing method or etch-back until the oxide film pattern 308b is exposed. Thereafter, the polysilicon film 311 doped with phosphorus is deposited and patterned. In the third embodiment, the polysilicon film 310 is patterned.

Figure 14A:
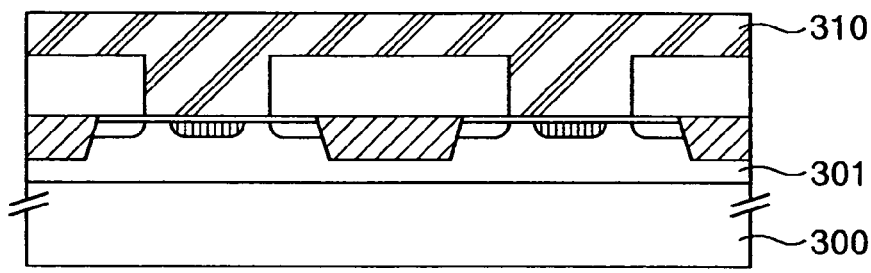
FIGS. 14A to 14D are cross sectional diagrams illustrating an example of a method of manufacturing a nonvolatile semiconductor memory device according to a third embodiment of the invention.
Figure 14B:
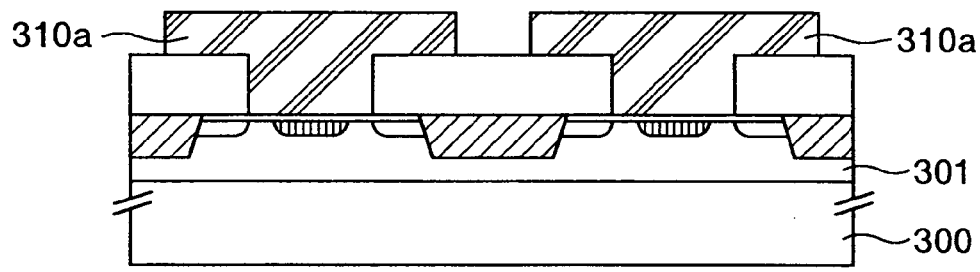

The polysilicon film 310 completely filling the gap is patterned (FIG. 14A) by lithography and dry etching techniques to form floating gates (FIG. 14B).

Figure 14C:
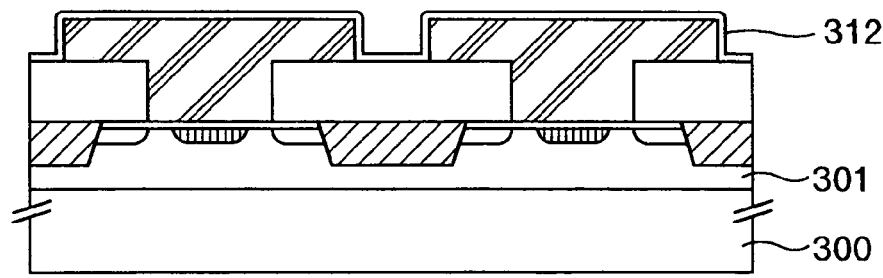
Figure 14D:
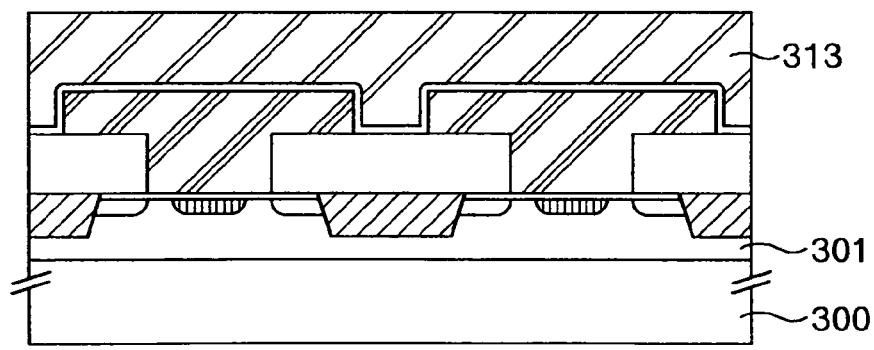

Thereafter, an insulator film 312 is formed to separate the floating gate from the control-gate (FIG. 14C). This insulator film may be a silicon oxide film or a stacked film of silicon oxide film/silicon nitride film/silicon oxide film. Next, a stacked film of polysilicon film/tungsten nitride film/tungsten film, or so called polymetal film 313, is deposited and patterned by well known lithography and dry etching techniques to form word lines. The silicon oxide film or stacked film 312 of silicon oxide film/silicon nitride film/silicon oxide film, and the polysilicon film 310a are sequentially etched to complete the floating gate (FIG. 14D).

Although not shown, after an interlayer insulating film is formed, contact holes are formed reaching the word line 313, source/drain diffusion layers 305, and well 301. A metal film is thereafter deposited and patterned to form metal wires and complete memory cells.

Similar to the first embodiment, according to the memory cell of this embodiment, it was possible to retain the breakdown voltage between the diffusion layer and well while the resistance to punch-through between the source and drain is improved.

Fourth Embodiment

Figure 15A:
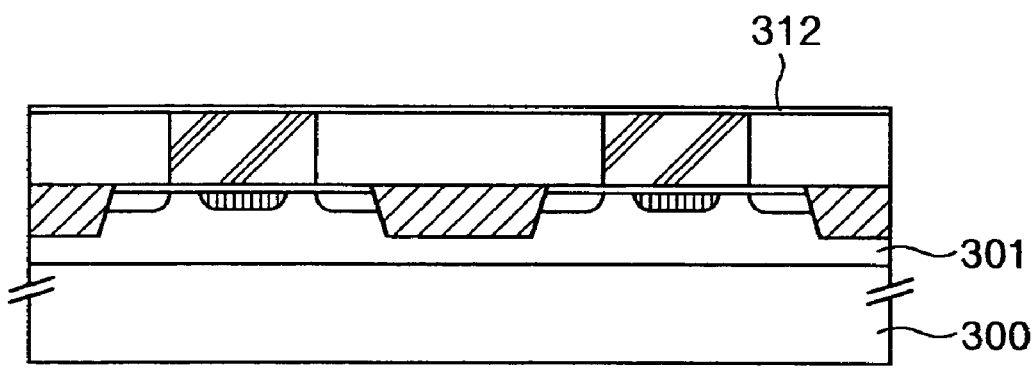
FIGS. 15A and 15B are cross sectional diagrams illustrating an example of a method of manufacturing a nonvolatile semiconductor memory device according to a fourth embodiment of the invention.
Figure 15B:
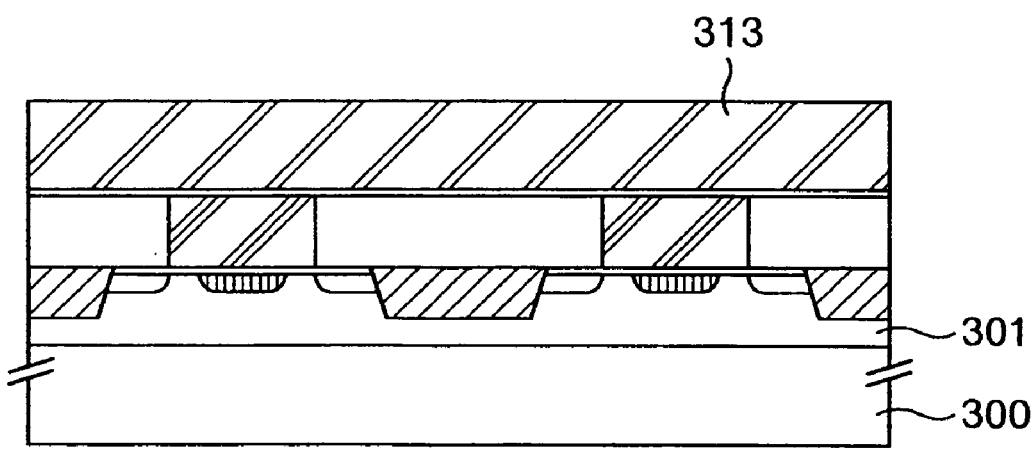

In the third embodiment, after the polysilicon film doped with phosphorous to be used as the floating gate is deposited completely filling the gap (FIG. 14A), the floating gates are formed by lithography and dry etching techniques. In the fourth embodiment, after the floating gate is formed by a chemical mechanical polishing method, an insulator film 312 is formed to separate the floating gate from the control gate (FIG. 15A). This insulator film may be a silicon oxide film or a stacked film of silicon oxide film/silicon nitride film/silicon oxide film. Next, a stacked film of polysilicon film/tungsten nitride film/tungsten film, or so called polymetal film 313, is deposited and patterned by well known lithography and dry etching techniques to form word lines. The silicon oxide film or stacked film 312 of silicon oxide film/silicon nitride film/silicon oxide film, and the polysilicon film 310a are sequentially etched to complete the floating gate (FIG. 15B).

Although not shown, after an interlayer insulating film is formed, contact holes are formed reaching the word line 313, source/drain diffusion layers 305, and well 301. A metal film is thereafter deposited and patterned to form metal wires and complete memory cells.

Similar to the first embodiment, according to the memory cell of this embodiment, it was possible to retain the breakdown voltage between the diffusion layer and well while the resistance to punch-through between the source and drain is improved.

Fifth Embodiment

Figure 16A:
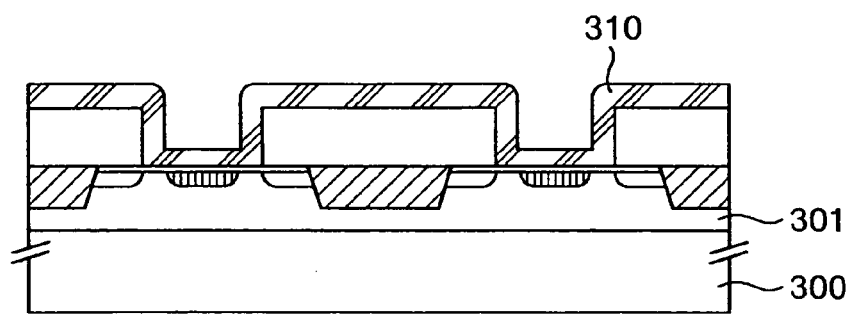
FIGS. 16A to 16D are cross sectional diagrams illustrating an example of a method of manufacturing a nonvolatile semiconductor memory device according to a fifth embodiment of the invention.
Figure 16B:
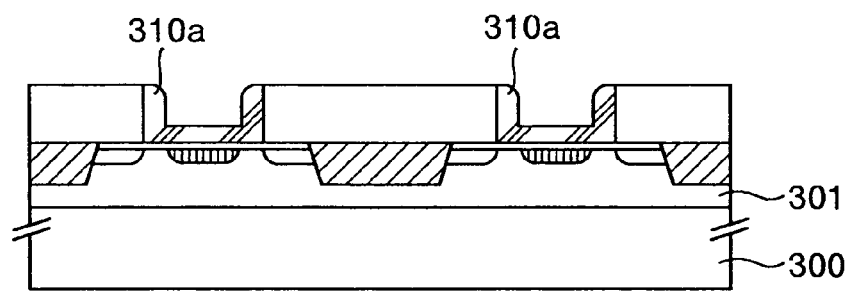

By using processes similar to those of the second to fourth embodiments, the heavily impurity doped regions 306 are formed (FIG. 10C or FIG. 11), the side wall 309a, or deposited silicon nitride film or polysilicon film 309 is removed by wet etching or isotropic dry etching. Thereafter, a polysilicon film doped with phosphorus to be used as the floating gate is deposited to the extent that the gap is not completely filled (FIG. 16A). The polysilicon film 310 to be used as the floating gate is worked by photoresist coating and etch-back similar to the first embodiment (FIG. 16B). The floating gate may be formed by a chemical mechanical polishing method.

Figure 16C:
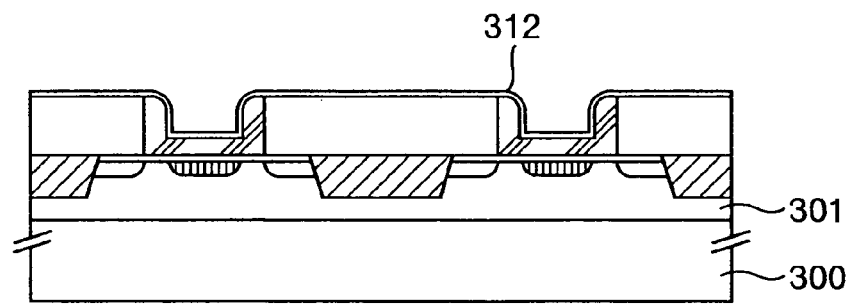
Figure 16D:
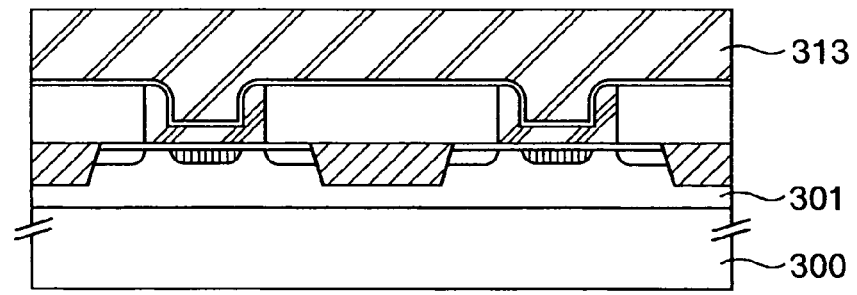

Thereafter, an insulator film 312 is formed to separate the floating gate from the control gate (FIG. 16C). This insulator film may be a silicon oxide film or a stacked film of silicon oxide film/silicon nitride film/silicon oxide film. Next, a stacked film of polysilicon film/tungsten nitride film/tungsten film, or so called polymetal film 313, is deposited and patterned by well known lithography and dry etching techniques to form word lines. The silicon oxide film or stacked film 312 of silicon oxide film/silicon nitride film/silicon oxide film, and the polysilicon film 310a are sequentially etched to complete the floating gate (FIG. 16D).

Although not shown, after an interlayer insulating film is formed, contact holes are formed reaching the word line 313, source/drain diffusion layers 305, and well 301. A metal film is thereafter deposited and patterned to form metal wires and complete memory cells.

Similar to the first embodiment, according to the memory cell of this embodiment, it was possible to retain the breakdown voltage between the diffusion layer and well while the resistance to punch-through between the source and drain is improved.

Sixth Embodiment

Figure 17A:
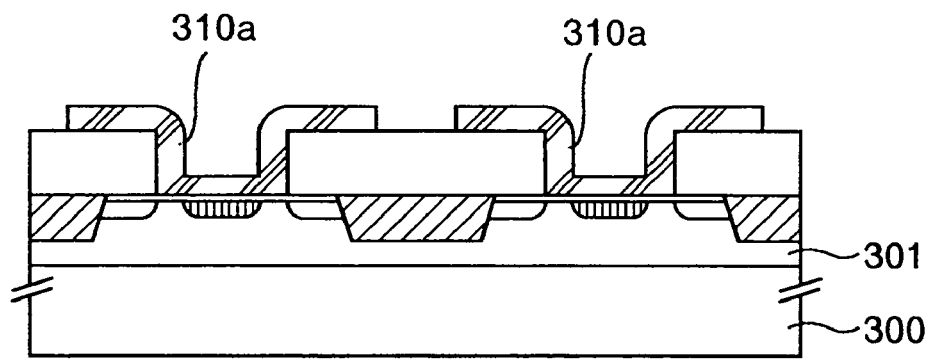
FIGS. 17A to 17C are cross sectional diagrams illustrating an example of a method of manufacturing a nonvolatile semiconductor memory device according to a sixth embodiment of the invention.

By using the processes similar to the fifth embodiment, after the polysilicon film doped with phosphorous to be used as the floating gate is deposited to the extent that the gap is not completely filled (FIG. 16A), the floating gate can be worked with lithography and dry etching techniques (FIG. 17A).

Figure 17B:
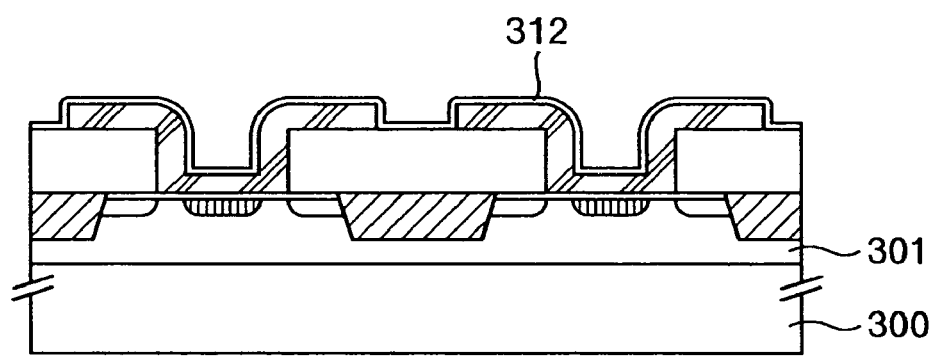
Figure 17C:
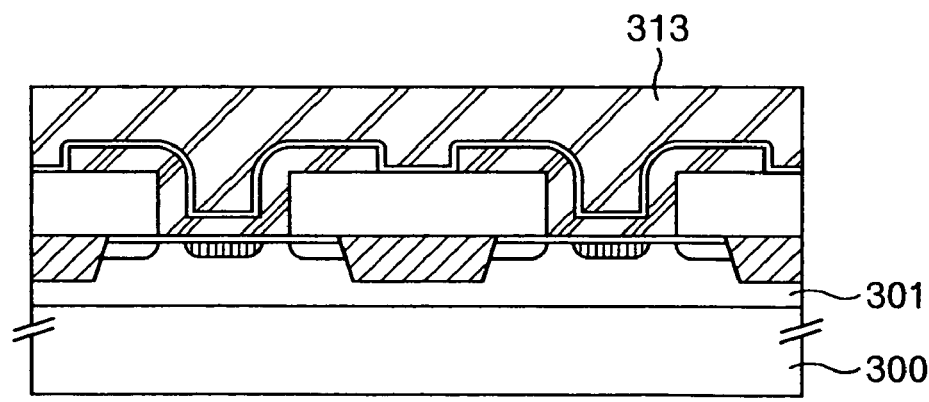

Thereafter, an insulator film 312 is formed to separate the floating gate from the control gate (FIG. 17B). This insulator film may be a silicon oxide film or a stacked film of silicon oxide film/silicon nitride film/silicon oxide film. Next, a stacked film of polysilicon film/tungsten nitride film/tungsten film, or so called polymetal film 313, is deposited and patterned by well known lithography and dry etching techniques to form word lines. The silicon oxide film or stacked film 312 of silicon oxide film/silicon nitride film/silicon oxide film, and the polysilicon film 310a are sequentially etched to complete the floating gate (FIG. 17C).

Although not shown, after an interlayer insulating film is formed, contact holes are formed reaching the word line 313, source/drain diffusion layers 305, and well 301. A metal film is thereafter deposited and patterned to form metal wires and complete memory cells.

Similar to the first embodiment, according to the memory cell of this embodiment, it was possible to retain the breakdown voltage between the diffusion layer and well while the resistance to punch-through between the source and drain is improved.

Seventh Embodiment

If the polysilicon film doped with phosphorus to be used as the floating gate is deposited to the extent that the gap is not completely filled as in the fifth and sixth embodiments, the heavily impurity doped region 306 may be formed by positively utilizing the recess of the polysilicon film.

Figure 18A:
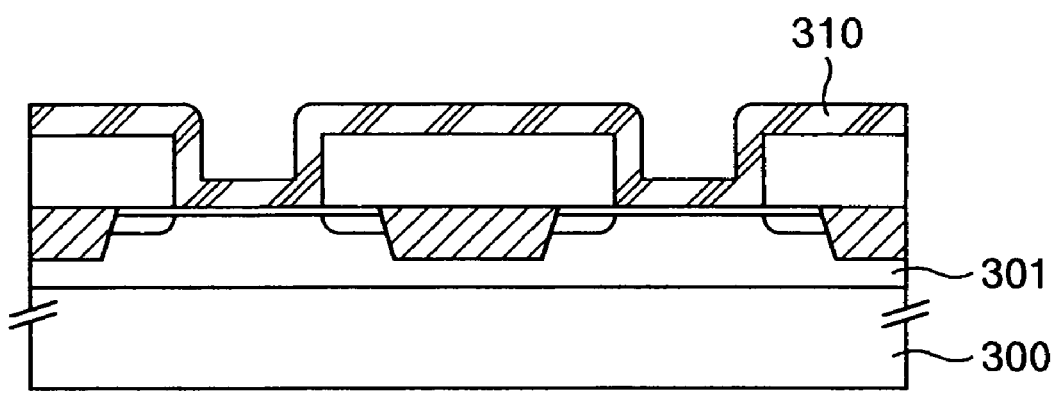
FIGS. 18A and 18B are cross sectional diagrams illustrating an example of a method of manufacturing a nonvolatile semiconductor memory device according to a seventh embodiment of the invention.
Figure 18B:
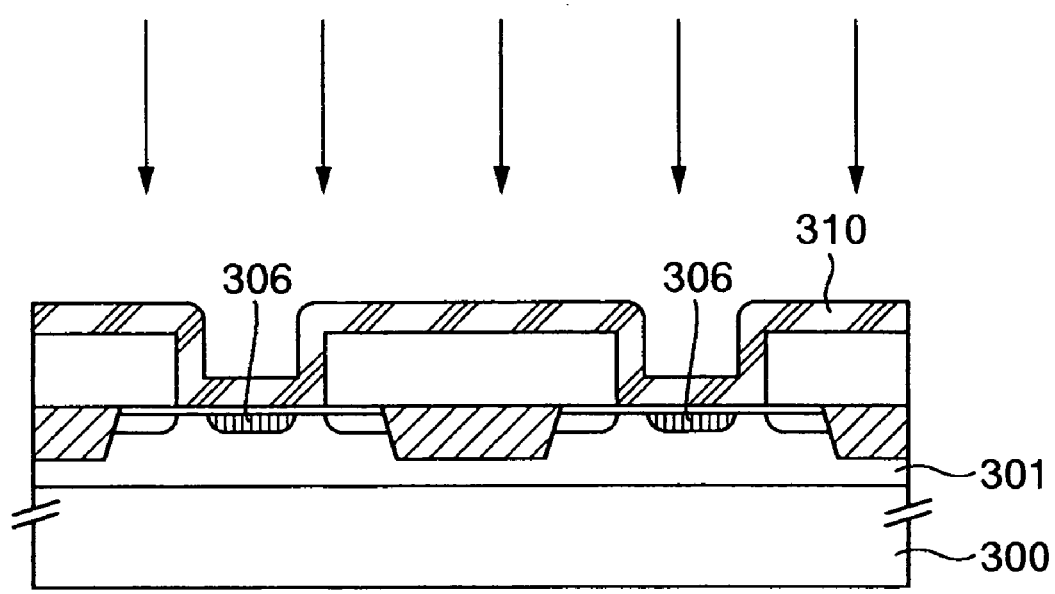

After the process of the second embodiment shown in FIG. 9C, a polysilicon film 310 doped with phosphorus to be used as the floating gate is deposited to the extent that the gap is not completely filled (FIG. 18A). Then, boron or boron fluoride ions are implanted vertically through the recess to form heavily impurity doped regions (FIG. 18B).

In this embodiment, the processes (FIGS. 10A and 10B) of depositing the silicon nitride film or polysilicon film 309 and forming the side walls 309a by etch-back can be omitted so that manufacture processes can be simplified.

Thereafter, the floating gate is formed by photoresist coating and etch-back or a chemical mechanical polishing method as in the fifth embodiment, and an insulator film 312 is formed to separate the floating gate from the control gate. This insulator film may be a silicon oxide film or a stacked film of silicon oxide film/silicon nitride film/silicon oxide film. Next, a stacked film of polysilicon film/tungsten nitride film/tungsten film, or so called polymetal film 313, is deposited and patterned by well known lithography and dry etching techniques to form word lines. The silicon oxide film or stacked film 312 of silicon oxide film/silicon nitride film/silicon oxide film, and the polysilicon film 310a are sequentially etched to complete the floating gate.

Although not shown, after an interlayer insulating film is formed, contact holes are formed reaching the word line 313, source/drain diffusion layers 305, and well 301. A metal film is thereafter deposited and patterned to form metal wires and complete memory cells.

Similar to the first embodiment, according to the memory cell of this embodiment, it was possible to retain the breakdown voltage between the diffusion layer and well while the resistance to punch-through between the source and drain is improved.

In the second to seventh embodiments, so-called AND type memory cells are used. These processes are also applicable to other stacked type memory cells such as NAND type memory cells and NOR type memory cells.

Eighth Embodiment

Figure 21A:
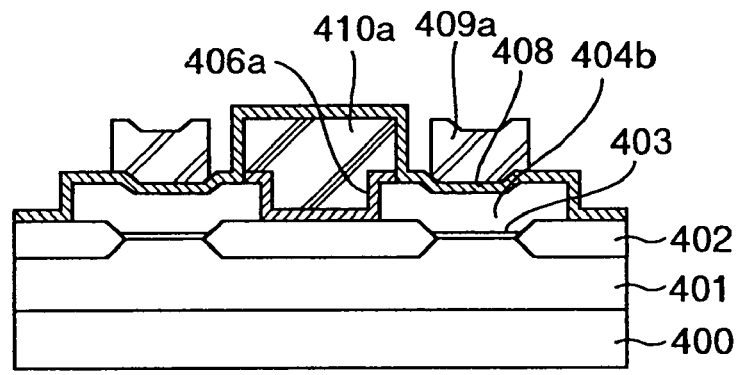
FIGS. 21A to 21C are cross sectional views respectively taken along lines XXIA—XXIA, XXIB—XXIB and XXIC—XXIC shown in FIG. 20.
Figure 21B:
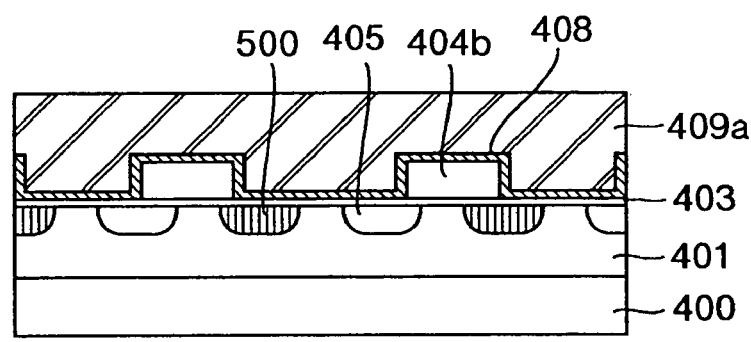
Figure 21C:
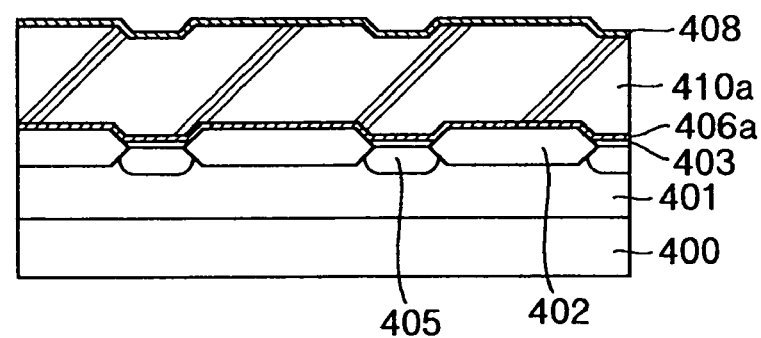

FIG. 20 and FIGS. 21A to 21C are a plan view and cross sectional views of a nonvolatile semiconductor memory device according to an eighth embodiment of the invention. The nonvolatile semiconductor memory device of this embodiment has the three-layer structure of a floating gate 404b, a control gate 409a and an erase gate 410a. A so-called Sandisk type memory cell is used as the base form, having the erase gate made of one layer and a split-gate structure made of two layers and including the floating gate and control gate. FIGS. 21A, 21B and 21C are cross sectional views respectively taken along lines XXI1–XXIA, XXIB—XXIB and XXIC—XXIC shown in FIG. 20.

As shown in FIG. 21B, the floating gate 404b and control gate 409a are formed on the well. Near the boundary between the floating gate and one control gate, a source/drain layer 405 is formed, and near the boundary between the floating gate and another control gate, a heavily impurity doped region 500 is formed. The source/drain diffusion layers extend in the y-direction and function as a local bit line and a local source line of each memory cell. The memory cell of this embodiment is a virtual ground type that shares the source/drain diffusion regions with adjacent memory cells.

FIGS. 22A–22C, 23A–23D, 24A–24C, and 25A–25B are cross sectional views illustrating an example of a method of manufacturing the nonvolatile semiconductor memory device according to the eighth embodiment of the invention.

Figure 22A:
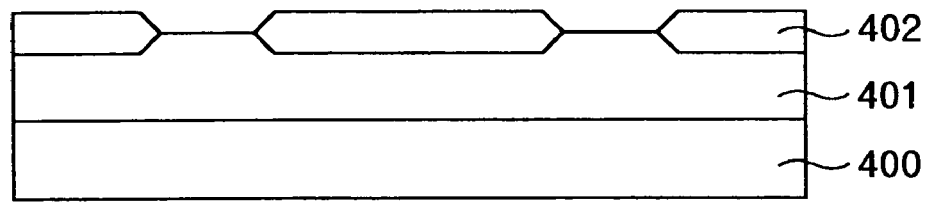
FIGS. 22A to 22C are cross sectional diagrams illustrating an example of a method of manufacturing a nonvolatile semiconductor memory device according to the eighth embodiment.
Figure 22B:
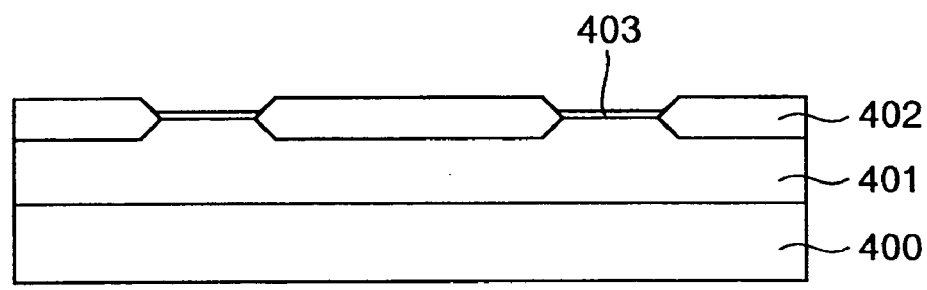
Figure 22C:
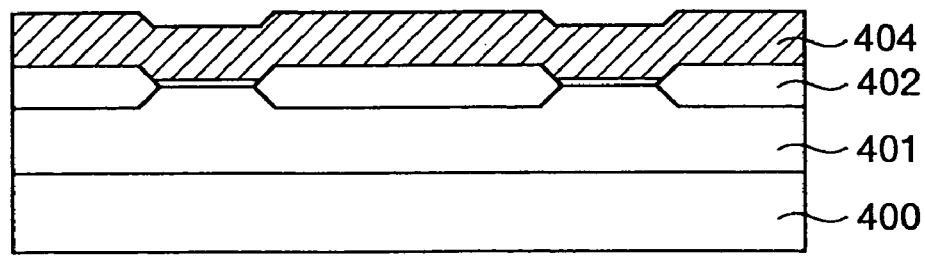
Figure 23A:
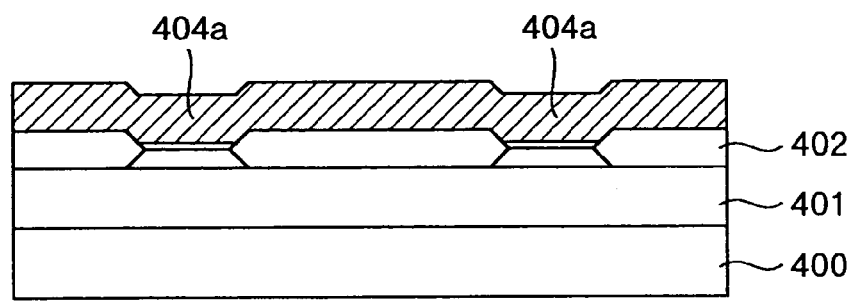
FIGS. 23A to 23D are cross sectional diagrams illustrating the method of manufacturing a nonvolatile semiconductor memory device according to the eighth embodiment.
Figure 23B:
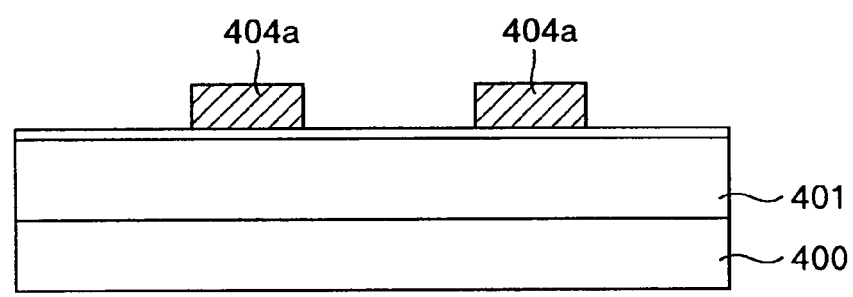

First, a p-type well 401 was formed in a silicon substrate 400, and field oxide films 402 as element separation regions were formed on the p-type well 401 (FIG. 22A). Next, a gate oxide film 403 was formed, for example, by a thermal oxidation method (FIG. 22B). A polysilicon film 404 doped with phosphorous to be used as the floating gate was deposited (FIG. 22C). Then the polysilicon film 404 was patterned by lithography and dry etching techniques to form floating gates 404a. The cross sectional views taken along lines XXIA—XXIA and XXIB—XXIB are shown in FIGS. 23A and 23B.

Similar to the first embodiment, in the eighth embodiment having the split-gate type cell structure, by using the floating gate 404a as a mask, it is possible to form the source/drain diffusion layer 405 and heavily impurity doped region 500 through tilted ion implantation in opposite directions without contacting them.

Figure 23C:
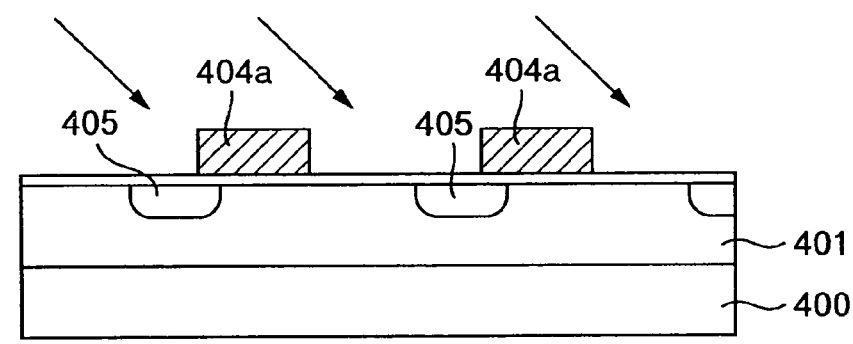

Specifically, arsenic ions are implanted into the well 401 through tilted ion implantation to form the source/drain diffusion layer 405 (FIG. 23C). Diffusion layers 405 function as source lines or drain lines of memory cells. During this ion implantation, the polysilicon film 404a functions as a mask so that the diffusion layer 405 can be formed in a self-alignment manner relative to the polysilicon layer 404a. The polysilicon film and the element separation silicon oxide film 402 are used as a mask. It is important that the angle of tilted ion implantation is not set too large relative to the substrate normal so that the diffusion layer 405 is formed also in the well not covered with the element separation silicon oxide film 402 as shown in the cross sectional view of FIG. 21C. In this manner, the diffusion layer 405 is formed extending in the y-direction. Since the diffusion layer 405 is formed by tilted ion implantation, irradiated ions are shaded by the polysilicon film 404a and ions are not implanted into the whole region between the polysilicon films 404a. Since ions are implanted in a slanted direction, the diffusion layer 405 is formed also in the partial region under the polysilicon film 404a. Therefore, the floating gate 404a and diffusion layer 405 are formed being partially overlapped so that channel is also formed in the well under the floating gate 404a.

Figure 23D:
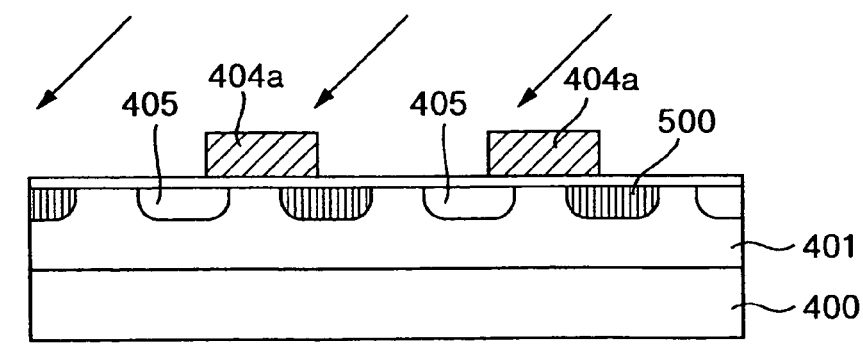

Next, boron ions or boron fluoride ions are implanted into the well 401 by tilted ion implantation to form heavily impurity doped regions 500 (FIG. 23D). The direction of tilted ion implantation is opposite to that used for forming the diffusion layer 405 shown in FIG. 23C. The heavily impurity doped region 500 improves the resistance to punch-through between a source and drain. During this ion implantation, the polysilicon film 404a functions as a mask so that the heavily impurity doped region 500 can be formed in a self-alignment manner relative to the polysilicon film 404a. Since the heavily impurity doped region 500 is formed by tilted ion implantation, irradiated ions are shaded by the polysilicon film 404a so that the heavily impurity doped region 500 is not formed in the whole region between the polysilicon films 404a. Since ions are implanted in a slanted direction opposite to that used for forming the diffusion layer 405, it is possible to make the diffusion layer 405 and heavily impurity doped region 500 not contact each other between the polysilicon films 404a. Therefore, as compared with not forming the heavily impurity doped region 500, the breakdown voltage between the diffusion layer and well is less degraded. Since the heavily impurity doped region 500 is formed by titled ion implantation, the heavily impurity doped region 500 is also formed in a partial region under the polysilicon film 404a. The resistance to punch-through in the regions under both the floating gate 404b and control gate 409a can be improved. The order of forming the diffusion layer 405 and highly impurity doped region 500 may be reversed.

Figure 24A:
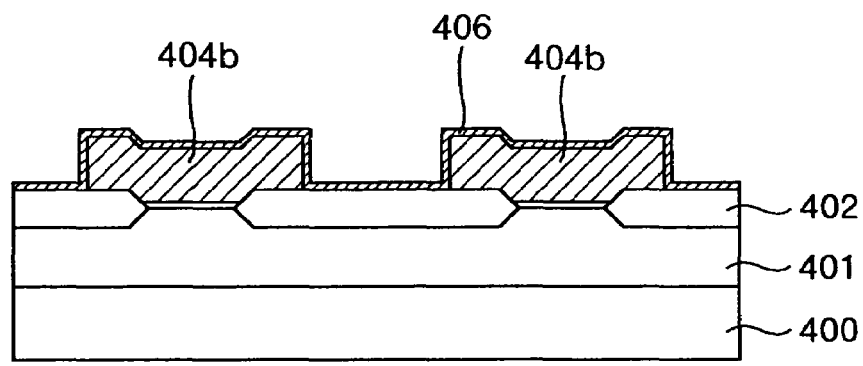
FIGS. 24A to 24C are cross sectional diagrams illustrating the method of manufacturing a nonvolatile semiconductor memory device according to the eighth embodiment.
Figure 24B:
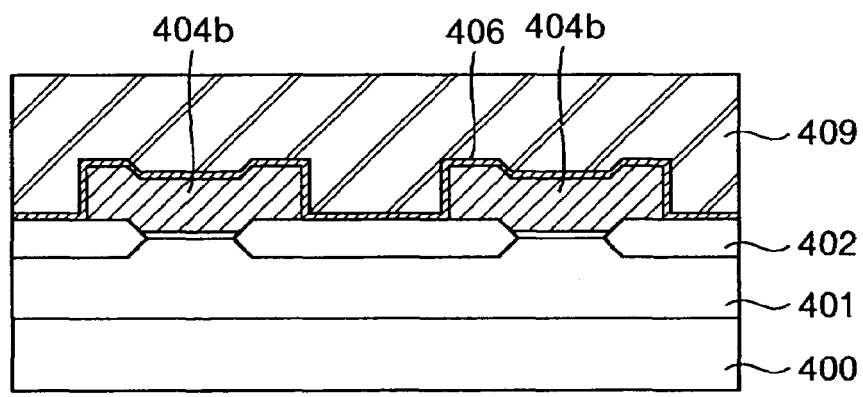

Next, the floating gate extending in the y-direction is worked by using lithography and dry etching techniques, and an insulator film 406 is formed for separating the floating gate and control gate (FIG. 24A).

Figure 24C:
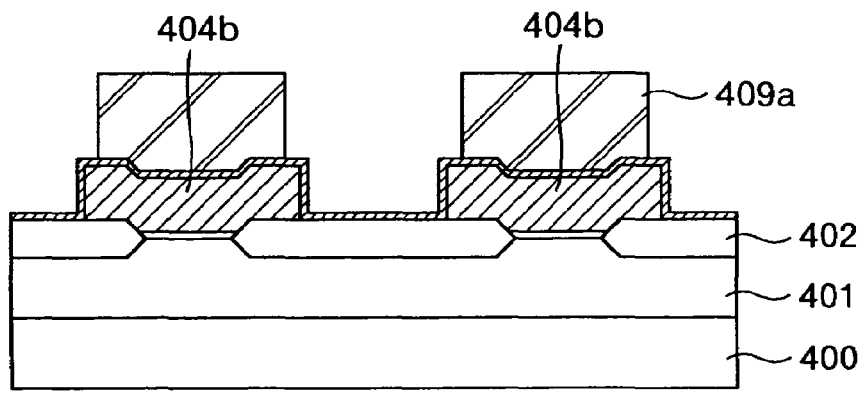

Next, a stacked film of polysilicon film/tungsten nitride film/tungsten film, or so called polymetal film 409, is deposited (FIG. 24B) and patterned by well known lithography and dry etching techniques to form word lines (FIG. 24C).

Figure 25A:
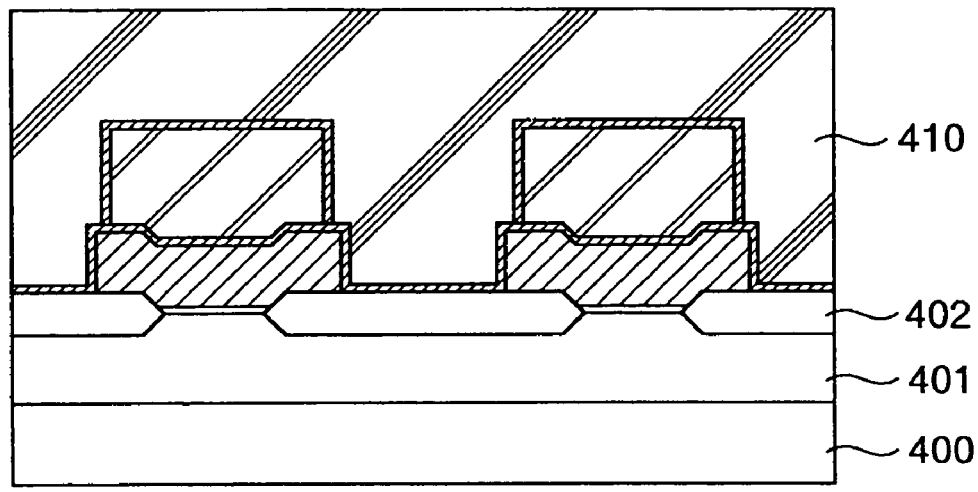
FIGS. 25A and 25B are cross sectional diagrams illustrating the method of manufacturing a nonvolatile semiconductor memory device according to the eighth embodiment.
Figure 25B:
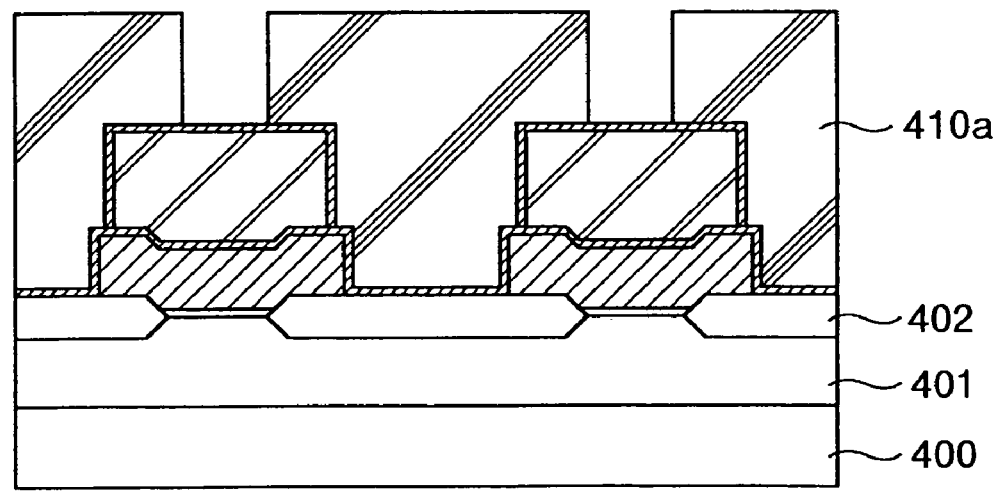

A polysilicon film 410 doped with phosphorous to be used as the first gate is deposited (FIG. 25A) and patterned by using lithography and dry etching techniques to form erase gates (FIG. 25B).

Although not shown, after an interlayer insulating film is formed, contact holes are formed reaching the word line 409a, source/drain diffusion layers 405, well 401 and erase gate 410a. A metal film is thereafter deposited and patterned to form metal wires and complete memory cells.

Similar to the first embodiment, according to the memory cell of this embodiment, it was possible to retain the breakdown voltage between the diffusion layer and well while the resistance to punch-through between the source and drain is improved.

In the first to eighth embodiments of the invention, although the heavily impurity doped regions 501, 306 and 500 are formed in a self-alignment manner, they may be formed by using a mask. Also in this case, similar to the first embodiment, the breakdown voltage between the diffusion layer and well was able to be retained while the resistance to punch-through between the drain and source is improved. In the first to eighth embodiments, implantation of ions having the same conductivity type as the well is used only for the heavily impurity doped regions 501, 306 and 500 formed in a self-alignment manner. In addition to this, ions may be implanted into the whole channel region at an energy level similar to the conventional level. In this case, the breakdown voltage between the diffusion layer and well is hardly degraded. The punch-through resistance can be improved because ions are implanted in the whole channel region between the source and drain.

Typical effects obtained by the above-described embodiments will be described briefly in the following.

Since punch-through of a nonvolatile semiconductor memory device to be caused by a short channel can be prevented, the area of a memory cell can be reduced.

It is possible to reduce defective nonvolatile semiconductor memory devices to be caused by punch-through and to improve manufacture yield.

It should be further understood by those skilled in the art that although the foregoing description has been made with respect to preferred embodiments of the invention, the invention is not limited thereto and various changes and modifications may be made without departing from the spirit of the invention and the scope of the appended claims.

What is claimed is:

1. A manufacture method for a nonvolatile semiconductor memory device comprising:

a step of forming a well of a first conductivity type in a semiconductor substrate;

a step of forming a pair of semiconductor regions of a second conductivity type in the well of the first conductivity type, the pair of semiconductor regions being used as a source and a drain;

a step of forming a first gate on the semiconductor substrate via a first gate insulator;

a step of forming a second gate on a second insulator film covering the first gate; and a step of forming a third gate via the second insulator film relative to the first gate and via a third insulator film relative to the semiconductor substrate, wherein an impurity doped region of the first conductivity type having an impurity concentration higher than the well is formed in a channel region between the pair of semiconductor regions, the impurity doped region being not in contact with the semiconductor regions, and wherein the semiconductor regions and the impurity region are formed in a self-alignment manner by tilted ion implantation tilted in opposite directions from a normal of the semiconductor substrate, by using one of the first to third gates as a mask.

2. A manufacture method for a nonvolatile semiconductor memory device according to claim 1, wherein the gate used as a mask for forming the impurity region through tilted ion implantation is one of a single layer film of polysilicon, a stacked film of a polysilicon film and a silicon oxide film, a stacked film of a polysilicon film and a silicon nitride film, and a stacked film of a polysilicon film, a silicon oxide film and a silicon nitride film.

3. A manufacture method for a nonvolatile semiconductor memory device according to claim 1, wherein the first conductivity type is a p-type and the second conductivity type is an n-type.

4. A manufacture method for a nonvolatile semiconductor memory device according to claim 1, wherein the first conductivity type is an n-type and the second conductivity type is a p-type.

5. A manufacture method for a nonvolatile semiconductor memory device according to claim 3, wherein p-type impurities are boron or boron fluoride ions and n-type impurities are arsenic ions.

6. A manufacture method for a nonvolatile semiconductor memory device according to claim 4, wherein n-type impurities are phosphorous ions and p-type impurities are boron or boron fluoride ions.

* * * * *